US012581895B2

(12) United States Patent
Song et al.

(10) Patent No.: US 12,581,895 B2
(45) Date of Patent: Mar. 17, 2026

(54) SUBSTRATE PROCESSING APPARATUS AND A METHOD OF PROCESSING A SUBSTRATE USING THE SAME

(71) Applicant: Samsung Electronics Co., Ltd., Suwon-si (KR)

(72) Inventors: Junghyun Song, Suwon-si (KR); Ansook Sul, Suwon-si (KR); Jeonghun Kang, Suwon-si (KR); Donok Choi, Suwon-si (KR); Sung Yong Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 469 days.

(21) Appl. No.: 18/059,594

(22) Filed: Nov. 29, 2022

(65) Prior Publication Data

US 2023/0360931 A1      Nov. 9, 2023

(30) Foreign Application Priority Data

May 3, 2022      (KR) ......................... 10-2022-0054692

(51) Int. Cl.
*H01L 21/67* (2006.01)
*C23C 16/44* (2006.01)
*C23C 16/455* (2006.01)

(52) U.S. Cl.
CPC .... *H01L 21/67057* (2013.01); *C23C 16/4412* (2013.01); *C23C 16/45563* (2013.01)

(58) Field of Classification Search
CPC ......... H01L 21/67057; H01L 21/67086; H01L 21/30604; H01L 21/67126; H01L 21/67253; H01L 21/6708; H01L 21/67051; H01L 21/31111; H01L 21/67028; H01L 21/32134; H01L 21/67075; H01L 21/02052; H01L 21/67023; H01L 21/02087; H01L 21/31133;

(Continued)

(56) References Cited

U.S. PATENT DOCUMENTS 4,736,758 A * 4/1988 Kusuhara ............... B01D 12/00
                                                              134/76
5,143,103 A * 9/1992 Basso ............... H01L 21/67028
                                                             134/107

(Continued)

FOREIGN PATENT DOCUMENTS

JP          6233570 B2    11/2017
KR    10-2001-0089292 A     9/2001

(Continued)

*Primary Examiner* — Rudy Zervigon
(74) *Attorney, Agent, or Firm* — Wolf, Greenfield & Sacks, P.C.

(57) ABSTRACT

A substrate processing apparatus includes an outer bath, an inner bath in the outer bath, a chemical solution supply pipe in fluid communication with a portion of the outer bath, and an outer gas supply pipe in fluid communication with another portion of the outer bath. The outer bath includes an outer body providing an outer receiving space, and an outer door coupled to the outer body and configured to close the outer receiving space. An end of the outer gas supply pipe is located in the outer receiving space between the outer body and the inner bath, and a portion of the chemical solution supply pipe is located in the inner bath.

14 Claims, 23 Drawing Sheets

(58) Field of Classification Search
CPC ........... H01L 21/02019; H01L 21/6704; C23C
16/4412; C23C 16/45563; C23F 1/00;
C23F 1/04; C23F 1/16; C23F 3/06; C23F
1/44; C23F 1/14; C23F 1/30; C23F 1/10;
C23F 3/03
See application file for complete search history.

(56) References Cited

U.S. PATENT DOCUMENTS

| | | | | | |
|---|---|---|---|---|---|
| 5,885,360 | A | * | 3/1999 | Han | ........................... B08B 3/10 |
| | | | | | 134/155 |
| 6,090,217 | A | * | 7/2000 | Kittle | ................ H01L 21/67028 |
| | | | | | 134/17 |
| 6,328,809 | B1 | * | 12/2001 | Elsawy | ............. H01L 21/67028 |
| | | | | | 134/1 |
| 6,381,872 | B1 | * | 5/2002 | Sasaki | ............... H01L 21/67034 |
| | | | | | 438/905 |
| 6,430,840 | B1 | * | 8/2002 | Jung | ................. H01L 21/02063 |
| | | | | | 34/409 |
| 6,790,291 | B2 | | 9/2004 | Kimura | |
| 7,165,563 | B1 | | 1/2007 | Boyd et al. | |
| 7,360,546 | B2 | | 4/2008 | Doi | |
| 7,541,285 | B2 | | 6/2009 | Abiko et al. | |
| 10,483,137 | B2 | | 11/2019 | Masutomi et al. | |
| 10,643,874 | B2 | | 5/2020 | Tanaka et al. | |
| 11,738,363 | B2 | * | 8/2023 | Carcasi | ............. H01L 21/67253 |
| | | | | | 216/84 |
| 2002/0032973 | A1 | * | 3/2002 | Jung | ................. H01L 21/67028 |
| | | | | | 257/E21.228 |
| 2005/0045208 | A1 | * | 3/2005 | Park | .................. H01L 21/02052 |
| | | | | | 257/E21.228 |
| 2006/0151006 | A1 | * | 7/2006 | Nam | .................. H01L 21/67028 |
| | | | | | 134/94.1 |
| 2016/0059271 | A1 | * | 3/2016 | Sekimoto | .......... H01L 21/67057 |
| | | | | | 134/34 |
| 2020/0211865 | A1 | * | 7/2020 | Otsu | ................. H01L 21/67086 |
| 2022/0388022 | A1 | * | 12/2022 | Carcasi | ............... B05C 11/1002 |

FOREIGN PATENT DOCUMENTS

| | | | |
|---|---|---|---|
| KR | 10-2002-0011600 | A | 2/2002 |
| KR | 1020070035363 | A | 3/2007 |
| KR | 10-2010-0059408 | A | 6/2010 |
| KR | 10-2020-0081246 | A | 7/2020 |

* cited by examiner

SUBSTRATE PROCESSING APPARATUS AND A METHOD OF PROCESSING A SUBSTRATE USING THE SAME

CROSS-REFERENCE TO RELATED APPLICATIONS

This U.S. non-provisional patent application claims priority under 35 U.S.C. § 119 to Korean Patent Application No. 10-2022-0054692, filed on May 3, 2022, in the Korean Intellectual Property Office, the entire contents of which are hereby incorporated by reference.

BACKGROUND OF THE INVENTION

The present disclosure relates to a substrate processing apparatus and a method of processing a substrate using the same, and more particularly, to a substrate processing apparatus capable of adjusting a boiling point of a chemical solution and a method of processing a substrate using the same.

A semiconductor device may be manufactured by various processes. For example, the semiconductor device may be manufactured by performing a photolithography process, an etching process, a deposition process, etc. on a wafer (e.g., silicon). The etching process may include a dry etching process and a wet etching process. In the wet etching process, a substrate may be placed in a bath and immersed in a chemical solution. The chemical solution may etch the substrate at a high-temperature.

SUMMARY

Embodiments of the inventive concepts may provide a substrate processing apparatus capable of adjusting a boiling point of a chemical solution, and a method of processing a substrate using the same.

Embodiments of the inventive concepts may also provide a substrate processing apparatus capable of improving an etching yield of a substrate, and a method of processing a substrate using the same.

Embodiments of the inventive concepts may further provide a substrate processing apparatus capable of performing a uniform process regardless of external pressure, and a method of processing a substrate using the same.

Embodiments of the inventive concepts may further provide a substrate processing apparatus capable of using chemical solutions having various concentrations, and a method of processing a substrate using the same.

Embodiments of the inventive concepts may further provide a substrate processing apparatus capable of keeping a concentration of a chemical solution constant in a process, and a method of processing a substrate using the same.

In an aspect, a substrate processing apparatus may include an outer bath, an inner bath in the outer bath, a chemical solution supply pipe extending into a portion of the outer bath, and an outer gas supply pipe in communication with the outer bath. The outer bath may include an outer body providing an outer receiving space, and an outer door coupled to the outer body and configured to cover the outer receiving space. An end of the outer gas supply pipe may be configured to supply gas to the outer receiving space between the outer body and the inner bath, and the chemical solution supply pipe may be configured to supply a chemical solution to the inner bath.

In an aspect, a substrate processing apparatus may include an outer bath, an inner bath in the outer bath, an outer gas supply pipe configured to supply a gas to an outer receiving space between the outer bath and the inner bath, and a gas supply unit configured to supply the gas into the outer gas supply pipe. The outer bath may include an outer body providing the outer receiving space, and an outer door coupled to the outer body and configured to cover the outer receiving space. The outer gas supply pipe may include a first outer gas pipe connected to the gas supply unit, and an outer gas fitting pipe coupled to the outer body. The first outer gas pipe may be fixed to the outer body through the outer gas fitting pipe.

In an aspect, a method of processing a substrate may include positioning a substrate in an inner bath configured to receive a chemical solution so that the substrate is in the chemical solution, closing an outer receiving space of an outer bath that surrounds the inner bath, circulating the chemical solution in the inner bath, and supplying a gas into the outer receiving space. The outer bath may include an outer body defining the outer receiving space, and an outer door coupled to the outer body and configured to close the outer receiving space. The circulating of the chemical solution in the inner bath may include supplying the chemical solution into the inner bath through a chemical solution supply pipe of which a portion is located in the inner bath. The supplying of the gas into the outer receiving space may include supplying the gas into the outer receiving space through an outer gas supply pipe coupled to the outer body.

DETAILED DESCRIPTION

Figure 1:
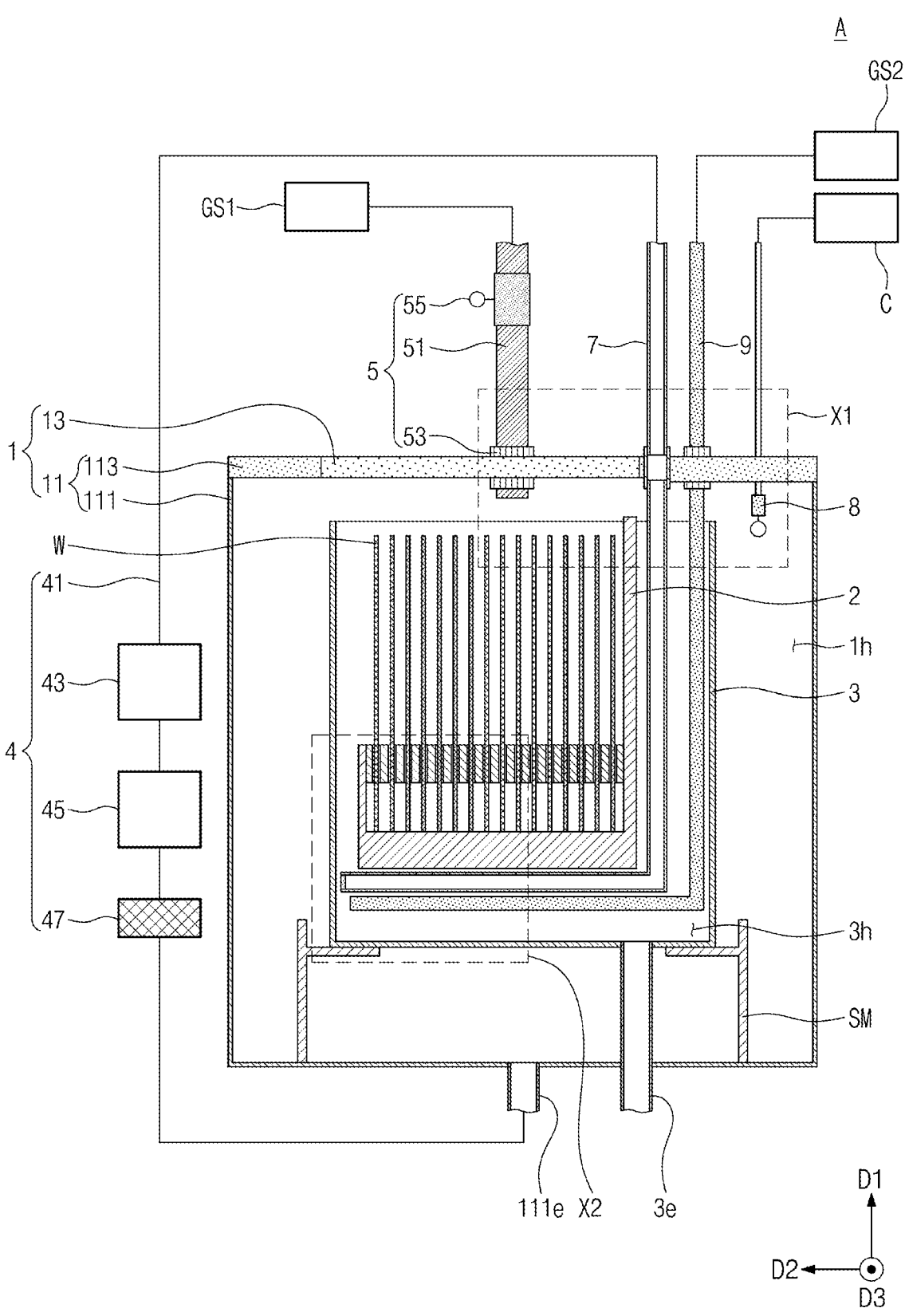
FIG. 1 is a cross-sectional view illustrating a substrate processing apparatus according to some embodiments of the inventive concepts.

Embodiments of the inventive concepts will now be described more fully with reference to the accompanying drawings. Like reference numerals or designators in the drawings denote like elements or components.

Figure 2:
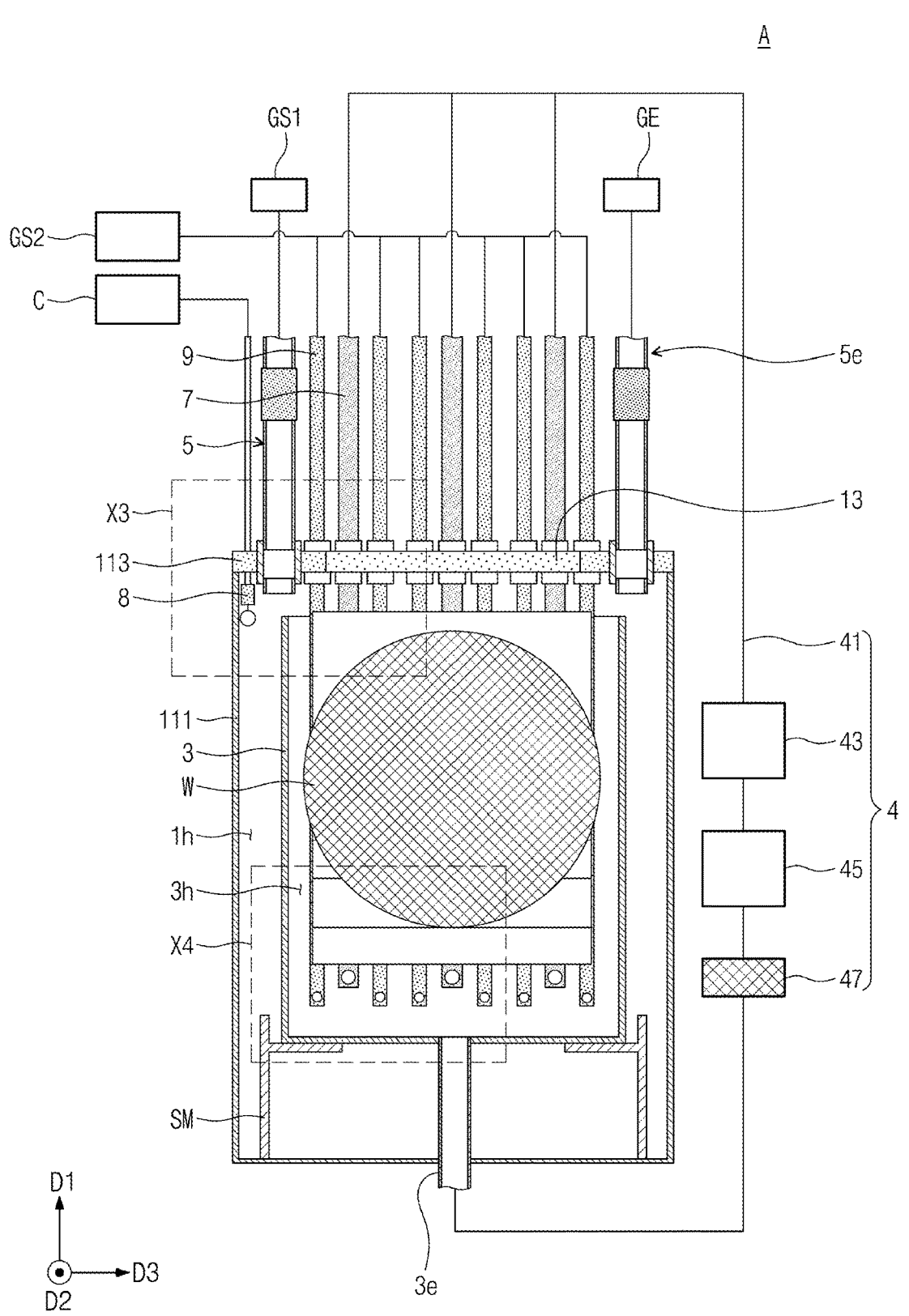
FIG. 2 is a cross-sectional view illustrating a substrate processing apparatus according to some embodiments of the inventive concepts.

FIG. 1 is a cross-sectional view illustrating a substrate processing apparatus according to some embodiments of the inventive concepts, and FIG. 2 is a cross-sectional view illustrating a substrate processing apparatus according to some embodiments of the inventive concepts.

Hereinafter, a reference designator D1 may be referred to as a first direction, a reference designator D2 intersecting the first direction D1 may be referred to as a second direction, and a reference designator D3 intersecting both the first direction D1 and the second direction D2 may be referred to as a third direction. The first direction D1 may be referred to as a vertical direction. In addition, each of the second direction D2 and the third direction D3 may be referred to as a horizontal direction.

Referring to FIGS. 1 and 2, a substrate processing apparatus A may be provided. The substrate processing apparatus A may be an apparatus for performing various processes on a substrate. The substrate may include, but is not limited to, a silicon (Si) wafer. The substrate processing apparatus A may perform an etching process on the substrate. More particularly, the substrate processing apparatus A may perform a wet etching process on the substrate. The substrate processing apparatus A may include an outer bath 1, an inner bath 3, an outer gas supply pipe 5, a gas exhaust pipe 5e, a chemical solution supply pipe 7, an inner gas supply pipe 9, a substrate supporter 2, a chemical solution circulation unit 4, a pressure measuring unit 8, a gas supply unit GS1, an inner gas supply unit GS2, and a control unit C.

The outer bath 1 may provide an outer receiving space 1h. The outer bath 1 may surround the inner bath 3. The outer receiving space 1h may be selectively sealed from a space outside the outer bath 1. This will be described later in detail. The outer bath 1 may include an outer body 11 and an outer door 13.

The outer body 11 may include a lower body 111 and a top plate member 113.

The lower body 111 may define the outer receiving space 1h. Thus, the lower body 111 may have a hollow pillar shape. For example, the lower body 111 may have a circular pillar shape. However, embodiments of the inventive concepts are not limited thereto, and the lower body 111 may have another shape. The lower body 111 may provide a chemical solution exhaust port 111e. The chemical solution exhaust port 111e may be located at a bottom end of the lower body 111. The chemical solution exhaust port 111e may be connected to the chemical solution circulation unit 4. A chemical solution exhausted through the chemical solution exhaust port 111e may be circulated through the chemical solution circulation unit 4. This will be described later in detail.

The top plate member 113 may be coupled onto the lower body 111. For example, the top plate member 113 may be coupled to a top of the lower body 111. The top plate member 113 may be fixed to the lower body 111. In some embodiments, the top plate member 113 may be coupled to the lower body 111 in one body. The top plate member 113 may cover a portion of the outer receiving space 1h. The top plate member 113 may provide an opening or substrate insertion hole 113h (see FIG. 10). The substrate insertion opening or hole 113h may vertically extend into or through the top plate member 113. The outer receiving space 1h may be connected to a space outside the outer body 11 through the substrate insertion hole 113h. This will be described later in detail.

The outer door 13 may be coupled to the outer body 11. More particularly, the outer door 13 may be selectively coupled to the outer body 11. The outer door 13 may cover or close the substrate insertion hole 113h. For example, the outer door 13 may be inserted in the substrate insertion hole 113h. However, embodiments of the inventive concepts are not limited thereto, and the outer door 13 may close the substrate insertion hole 113h while being located over the substrate insertion hole 113h. That the outer door 13 closes the substrate insertion hole 113h may mean that the outer door 13 is coupled to the outer body 11 to cover or close the outer receiving space 1h. In other words, the outer door 13 is coupled to the outer body 11 such that the outer receiving space 1h may be closed and isolated from the space outside the outer body 11.

The outer door 13 may be inserted in the substrate insertion hole 113h and coupled to the outer body 11 in the above embodiments, but embodiments of the inventive concepts are not limited thereto. In certain embodiments, the outer door 13 may be at a position spaced apart from the substrate insertion hole 113h to close the outer receiving space 1h. This will be described later in detail with reference to FIG. 19.

In some embodiments, the outer door 13 may seal the outer receiving space 1h. In other words, the outer receiving space 1h may be completely isolated from the space outside the outer body 11 by the outer door 13. In this case, a gas may not move between the outer receiving space 1h and the space outside the outer body 11. The sealing of the outer door 13 may be performed by various methods. For example, the outer door 13 may be inserted in the substrate insertion hole 113h by a tight-fitting method to seal the outer receiving space 1h. Alternatively, the outer door 13 may be coupled to the outer body 11 with an elastic member (e.g., an O-ring) inserted therebetween. Alternatively, the outer door 13 may be inserted in the substrate insertion hole 113h by using a screw coupling method. The outer door 13 may be coupled to the outer body 11 by other various methods to seal the outer receiving space 1h.

Even though not shown in the drawings, the outer door 13 and/or the substrate insertion hole 113h may have a circular shape when viewed in a plan view. However, embodiments of the inventive concepts are not limited thereto, and in certain embodiments, the outer door 13 and/or the substrate insertion hole 113h may have a rectangular shape or another shape.

The inner bath 3 may be in the outer bath 1. In other words, the inner bath 3 may be in the outer receiving space 1h. The inner bath 3 may be fixed at a certain position in the outer bath 1 by a supporting member SM. The inner bath 3 may provide an inner space 3h. A chemical solution may be provided in the inner bath 3. The etching process may be performed on a substrate W in a state in which the substrate W is immersed in the chemical solution in the inner bath 3. A top end of the inner bath 3 may be opened. Thus, the inner space 3h may be connected to the outer receiving space 1h. The inner bath 3 may include a bottom exhaust port 3e. The bottom exhaust port 3e may have a closed configuration and an open configuration. When maintenance of the inner bath 3 is required, the bottom exhaust port 3e may be opened to exhaust the chemical solution in the inner bath 3.

The outer gas supply pipe 5 may be configured to supply a gas into the outer bath 1. More particularly, the outer gas supply pipe 5 may be configured to supply the gas into a region or space, i.e., the outer receiving space 1h, between the outer bath 1 and the inner bath 3. To achieve this, an end of the outer gas supply pipe 5 may be in the outer receiving space 1h between the outer bath 1 and the inner bath 3. In addition, the outer gas supply pipe 5 may be in fluid communication with a portion of the outer bath 1. For example, the outer gas supply pipe 5 may be coupled to or extend into a portion of the outer body 11. This will be described later in detail. The gas supplied through the outer gas supply pipe 5 may be an inert gas. For example, the outer gas supply pipe 5 may be configured to supply a nitrogen (N2) gas, an argon (Ar) gas, and/or a neon (Ne) gas. The outer gas supply pipe 5 may include a first outer gas pipe 51, an outer gas fitting pipe 53, and a flow control unit 55. These will be described later in detail.

The gas exhaust pipe 5e may be configured to absorb the gas in the outer bath 1. More particularly, the gas exhaust pipe 5e may be configured to absorb the gas in the outer receiving space 1h between the outer bath 1 and the inner bath 3. To achieve this, an end of the gas exhaust pipe 5e may be in the outer receiving space 1h between the outer bath 1 and the inner bath 3. In addition, the gas exhaust pipe 5e may be in fluid communication with a portion of the outer bath 1. For example, the gas exhaust pipe 5e may be coupled to or extend into a portion of the outer body 11.

The chemical solution supply pipe 7 may be configured to supply the chemical solution into the inner bath 3. In other words, the chemical solution supply pipe 7 may be configured to supply the chemical solution into the inner space 3h. To achieve this, a portion of the chemical solution supply pipe 7 may be in the inner bath 3. In addition, the chemical solution supply pipe 7 may extend into or through another portion of the outer bath 1. For example, the chemical solution supply pipe 7 may be coupled to or extend into another portion of the outer body 11. This will be described later in detail. The chemical solution supplied through the chemical solution supply pipe 7 may be a chemical solution capable of etching the substrate W. For example, the chemical solution supply pipe 7 may be configured to supply a phosphoric acid (H$_3$PO$_4$) solution. However, embodiments of the inventive concepts are not limited thereto, and in certain embodiments, the chemical solution supply pipe 7 may be configured to supply another kind of a solution. In some embodiments, a plurality of chemical solution supply pipes 7 may be provided. The plurality of chemical solution supply pipes 7 may be spaced apart from each other in the third direction D3. However, a single chemical solution supply pipe 7 will be described hereinafter for the purpose of ease and convenience in explanation, although it should be understood that a plurality of solution supply pipes 7 may be used. The chemical solution supply pipe 7 will be described later in more detail.

The inner gas supply pipe 9 may be configured to supply a second gas into the inner bath 3. In other words, the inner gas supply pipe 9 may be configured to supply the second gas into the inner space 3h. To achieve this, a portion of the inner gas supply pipe 9 may be in the inner bath 3. In addition, the inner gas supply pipe 9 may extend into or through another portion of the outer bath 1. For example, the inner gas supply pipe 9 may be coupled to or extend into another portion of the outer body 11. This will be described later in detail. The second gas supplied through the inner gas supply pipe 9 may be an inert gas. For example, the inner gas supply pipe 9 may be configured to supply a nitrogen (N2)

gas, an argon (Ar) gas, and/or a neon (Ne) gas. In some embodiments, a plurality of inner gas supply pipes 9 may be provided. The plurality of inner gas supply pipes 9 may be spaced apart from each other in the third direction D3. Although it should be understood that a plurality of inner gas supply pipes 9 may be used, a single inner gas supply pipe 9 will be described hereinafter for the purpose of ease and convenience in explanation. The inner gas supply pipe 9 will be described later in more detail.

The substrate supporter 2 may support the substrate W. The substrate supporter 2 may be inserted in the inner bath 3. The substrate supporter 2 may be fixed at a certain position in the inner bath 3. For example, the substrate supporter 2 may be fixed at a certain position in the inner bath 3 by a supporting structure (not shown) connected to the inner bath 3 and/or the outer bath 1. Alternatively, the substrate supporter 2 may be supported by a supporting arm 6 (see FIG. 16) and thus may be fixed at a certain position in the inner bath 3. The substrate supporter 2 will be described later in more detail.

The chemical solution circulation unit 4 may be configured to circulate the chemical solution. The chemical solution circulation unit 4 may be connected to the chemical solution supply pipe 7 and the chemical solution exhaust port 111e. The chemical solution circulation unit 4 may transfer the chemical solution into the chemical solution supply pipe 7. A portion of the chemical solution supplied in the inner bath 3 through the chemical solution supply pipe 7 may overflow into the outer bath 1. The chemical solution flowing in the outer bath 1 may return to the chemical solution circulation unit 4 through the chemical solution exhaust port 111e. The chemical solution circulation unit 4 may include a circulation pipe 41, a heating unit 43, a concentration measuring unit 45, and a filter 47.

An end of the circulation pipe 41 may be connected to the chemical solution supply pipe 7, and another end of the circulation pipe 41 may be connected to the chemical solution exhaust port 111e. The chemical solution may be circulated along the circulation pipe 41.

The heating unit 43 may be located on the circulation pipe 41. The heating unit 43 may be configured to heat the chemical solution circulated along the circulation pipe 41. The heating unit 43 may include, but not limited to, an electric heating wire heater.

The concentration measuring unit 45 may be located on the circulation pipe 41. The concentration measuring unit 45 may be configured to measure a concentration of the chemical solution circulated along the circulation pipe 41.

The filter 47 may be located on the circulation pipe 41. The filter 47 may be configured to filter the chemical solution circulated along the circulation pipe 41.

The pressure measuring unit 8 may be configured to measure a pressure of the outer receiving space 1h. The pressure measuring unit 8 will be described later in more detail.

The gas supply unit GS1 may be connected to the outer gas supply pipe 5. The gas supply unit GS1 may be configured to supply the gas into the outer gas supply pipe 5. To achieve this, the gas supply unit GS1 may include a gas tank and a compressor.

The inner gas supply unit GS2 may be connected to the inner gas supply pipe 9. The inner gas supply unit GS2 may be configured to supply the second gas into the inner gas supply pipe 9. To achieve this, the inner gas supply unit GS2 may include a gas tank and a compressor.

A gas exhaust unit GE may be connected to the gas exhaust pipe 5e. The gas exhaust unit GE may be configured to absorb a gas from the gas exhaust pipe 5e.

The control unit C may control the chemical solution circulation unit 4, the gas supply unit GS1, the inner gas supply unit GS2, and/or the gas exhaust unit GE. The control unit C may receive data or information from the pressure measuring unit 8 to perform a control operation in such a way that a pressure in the outer bath 1 is maintained at a certain level. In addition, the control unit C may receive data or information from the concentration measuring unit 45 to perform a control operation in such a way that the concentration of the chemical solution is maintained at a certain level.

Figure 3:
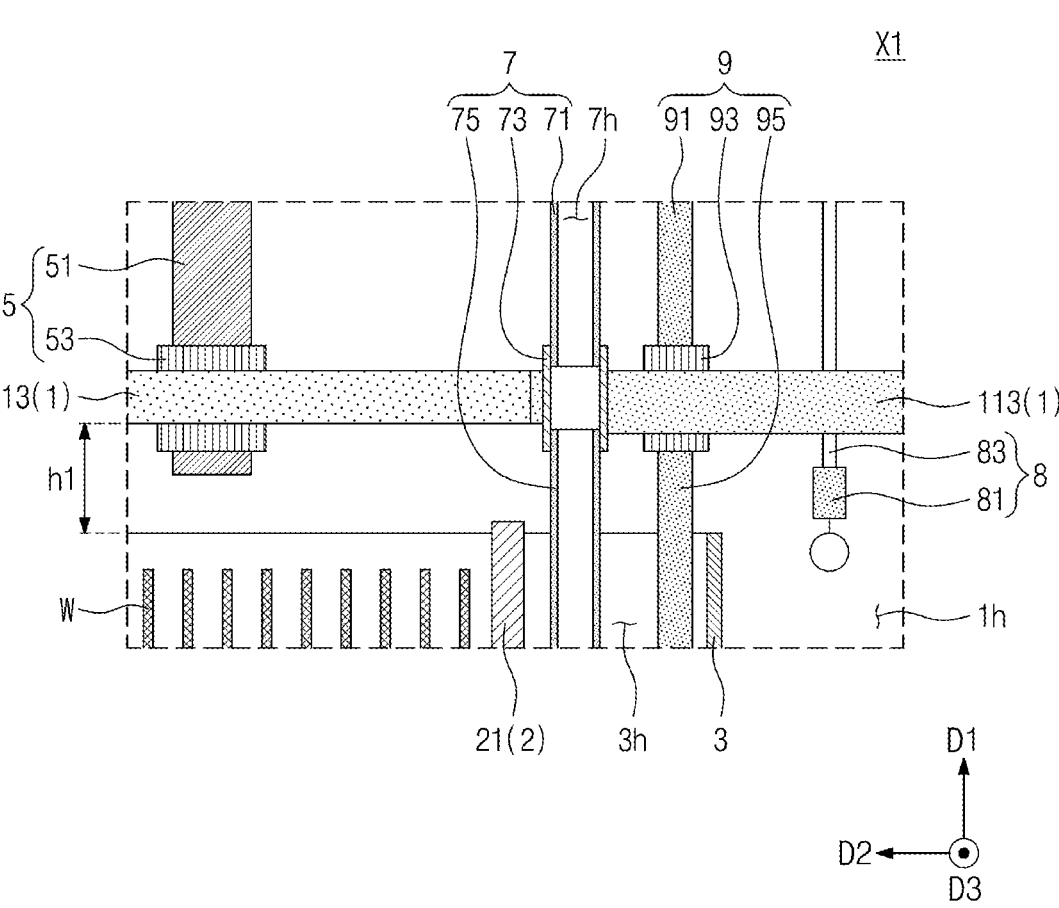
FIG. 3 is an enlarged cross-sectional view of a region 'X1' of FIG. 1.

FIG. 3 is an enlarged cross-sectional view of a region 'X1' of FIG. 1.

Referring to FIG. 3, a level of a top end of the inner bath 3 may be lower than a level of a bottom end of the outer door 13. More particularly, the inner bath 3 may be spaced downward from the outer door 13 by a first height h1. Thus, in a state in which the outer door 13 is coupled to the top plate member 113, the inner space 3h may be connected to the outer receiving space 1h.

The chemical solution supply pipe 7 may provide a chemical solution flow path 7h. The chemical solution may move along the chemical solution flow path 7h. The chemical solution supply pipe 7 may be coupled to or extend into a portion of the outer body 11. For example, the chemical solution supply pipe 7 may vertically extend into a portion of the top plate member 113. The chemical solution supply pipe 7 may include an outer chemical solution pipe 71, a chemical solution fitting pipe 73, and an inner chemical solution pipe 75.

The outer chemical solution pipe 71 may be located on the top plate member 113. The outer chemical solution pipe 71 may be connected to the chemical solution circulation unit 4 (see FIG. 2).

The chemical solution fitting pipe 73 may be coupled to the top plate member 113. More particularly, the chemical solution fitting pipe 73 may vertically extend into the top plate member 113. The outer chemical solution pipe 71 may be coupled to the chemical solution fitting pipe 73.

The inner chemical solution pipe 75 may be located under the top plate member 113. The inner chemical solution pipe 75 may be coupled to a bottom end portion of the chemical solution fitting pipe 73. The outer chemical solution pipe 71 and the inner chemical solution pipe 75 may be connected to each other by the chemical solution fitting pipe 73. At least a portion of the inner chemical solution pipe 75 may be located in the inner space 3h.

The chemical solution supply pipe 7 is coupled to the top plate member 113 through the chemical solution fitting pipe 73 in the above embodiments, but embodiments of the inventive concepts are not limited thereto. In certain embodiments, a single pipe may extend into the top plate member 113 and may be coupled to the top plate member 113. In this case, an additional structure for fitting may be provided between the single pipe and the top plate member 113.

The chemical solution supply pipe 7 is coupled to the top plate member 113 in the above embodiments, but embodiments of the inventive concepts are not limited thereto. In certain embodiments, the chemical solution supply pipe 7 may be coupled to the lower body 111 (see FIG. 1).

The inner gas supply pipe 9 may be coupled to or extend into a portion of the outer body 11. For example, the inner gas supply pipe 9 may vertically extend into a portion of the top plate member 113. The inner gas supply pipe 9 may include a first inner pipe 91, an inner fitting pipe 93, and a second inner pipe 95. At least the second inner pipe 95 may be referred to as a gas connection pipe.

The first inner pipe 91 may be located on the top plate member 113. The first inner pipe 91 may be connected to the inner gas supply unit GS2 (see FIG. 2).

The inner fitting pipe 93 may be coupled to the top plate member 113. More particularly, the inner fitting pipe 93 may vertically extend into the top plate member 113. The first inner pipe 91 may be coupled to the inner fitting pipe 93.

The second inner pipe 95 may be located under the top plate member 113. The second inner pipe 95 may be coupled to a bottom end portion of the inner fitting pipe 93. The first inner pipe 91 and the second inner pipe 95 may be connected to each other by the inner fitting pipe 93.

The pressure measuring unit 8 may include a pressure sensor 81 and a sensor supporter 83. The pressure sensor 81 may be in the outer receiving space 1h between the outer bath 1 and the inner bath 3. The pressure sensor 81 may include at least one of various components for measuring a pressure of a gas. For example, the pressure sensor 81 may include a primary pressure gauge such as a manometer and/or a barometer. Alternatively, the pressure sensor 81 may include a secondary pressure gauge such as a bourdon tube pressure gauge. However, embodiments of the inventive concepts are not limited thereto, and in certain embodiments, the pressure sensor 81 may include another kind of a pressure gauge capable of measuring a pressure of a gas in the outer receiving space 1h. The sensor supporter 83 may support the pressure sensor 81. In addition, the pressure sensor 81 may be connected to the control unit C (see FIG. 1) through the sensor supporter 83. The sensor supporter 83 may extend into or through the outer body 11, but embodiments of the inventive concepts are not limited thereto.

Figure 4:
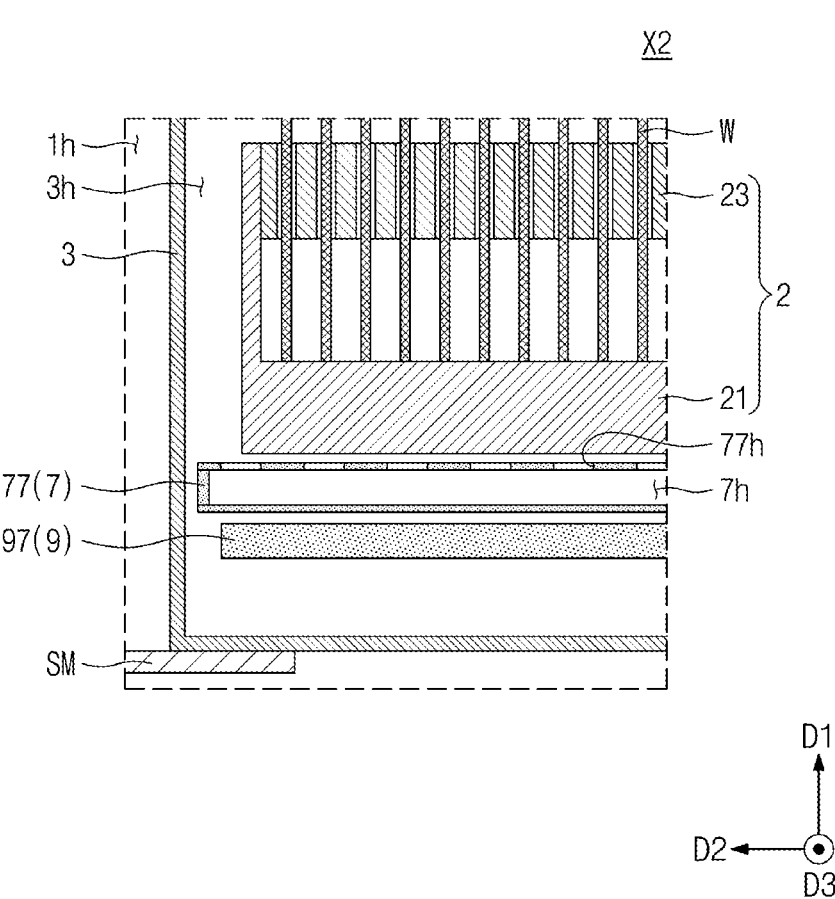
FIG. 4 is an enlarged cross-sectional view of a region 'X2' of FIG. 1.

FIG. 4 is an enlarged cross-sectional view of a region 'X2' of FIG. 1.

Referring to FIG. 4, the substrate supporter 2 may support the substrate W. The substrate supporter 2 may include a supporting body 21 and a guide member 23. The supporting body 21 may support the guide member 23. The guide member 23 may provide a slot (not indicated by a reference designator) in which the substrate W is inserted. In some embodiments, a plurality of slots may be provided. Thus, a plurality of the substrates W may be supported by a single substrate supporter 2.

The chemical solution supply pipe 7 may further include a chemical solution jet pipe 77. As illustrated in FIG. 1, the chemical solution jet pipe 77 may be coupled to a bottom end of the inner chemical solution pipe 75. The chemical solution jet pipe 77 may be in the inner bath 3. The chemical solution jet pipe 77 may extend in a horizontal direction. The chemical solution jet pipe 77 may provide a nozzle opening or hole 77h. The chemical solution flow path 7h may be connected to the inner space 3h through the nozzle hole 77h. The nozzle hole 77h may be positioned to face upward, but embodiments of the inventive concepts are not limited thereto. A plurality of nozzle holes 77h may be provided. The plurality of nozzle holes 77h may be spaced apart from each other in the second direction D2. Although it should be understood that a plurality of nozzle holes 77h may be used, a single nozzle hole 77h will be described hereinafter for the purpose of ease and convenience in explanation. The chemical solution jet pipe 77 may be located below the substrate supporter 2, but embodiments of the inventive concepts are not limited thereto.

The inner gas supply pipe 9 may further include an inner gas jet pipe 97. As illustrated in FIG. 1, the inner gas jet pipe 97 may be coupled to a bottom end of the second inner pipe 95. The inner gas jet pipe 97 may extend in a horizontal direction. Even though not shown in the drawings, the inner gas jet pipe 97 may provide a gas jet hole. The second gas in the inner gas supply pipe 9 may flow into the inner space 3h through the gas jet hole. The inner gas jet pipe 97 may be located below the chemical solution jet pipe 77.

Figure 5:
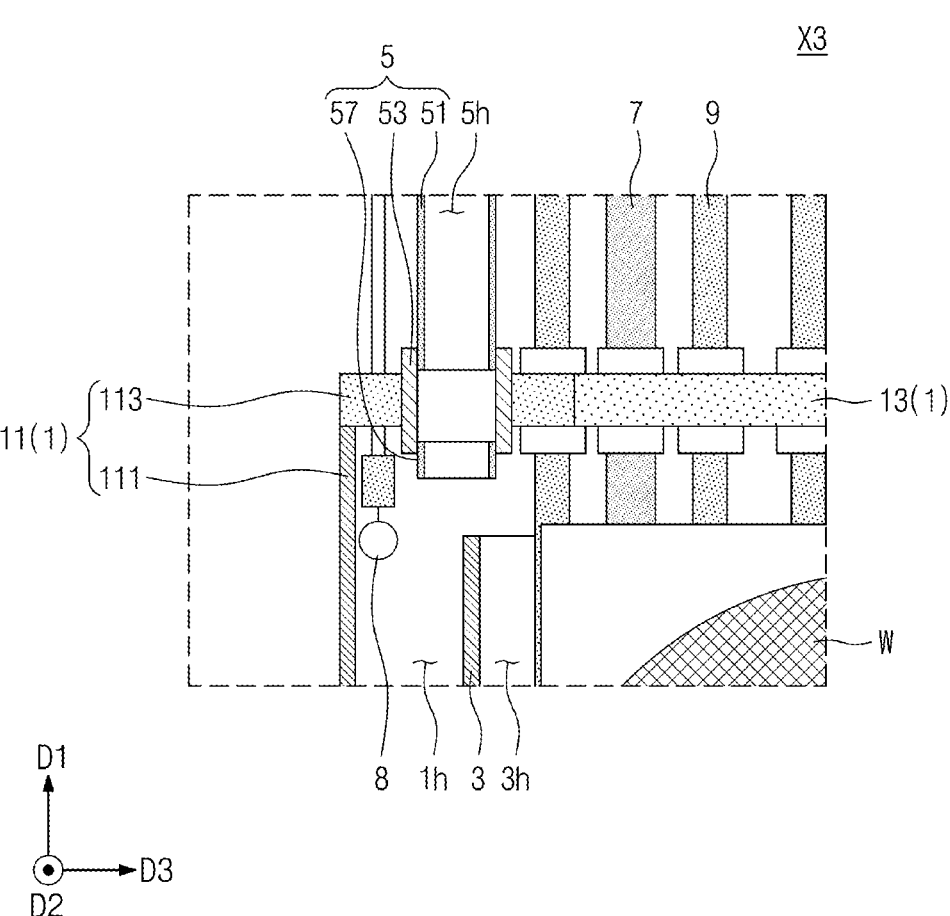
FIG. 5 is an enlarged cross-sectional view of a region 'X3' of FIG. 2.

FIG. 5 is an enlarged cross-sectional view of a region 'X3' of FIG. 2.

Referring to FIG. 5, the outer gas supply pipe 5 may provide a gas flow path 5h. The gas may move along the gas flow path 5h. The outer gas supply pipe 5 may be coupled to or extend into a portion of the outer body 11. For example, the outer gas supply pipe 5 may vertically extend into a portion of the top plate member 113. The outer gas supply pipe 5 may include the first outer gas pipe 51, the outer gas fitting pipe 53, and a second outer gas pipe 57.

The first outer gas pipe 51 may be located on the top plate member 113. The first outer gas pipe 51 may be connected to the gas supply unit GS1 (see FIG. 1).

The outer gas fitting pipe 53 may be coupled to the top plate member 113. More particularly, the outer gas fitting pipe 53 may vertically extend into the top plate member 113. The first outer gas pipe 51 may be coupled to the outer gas fitting pipe 53.

The second outer gas pipe 57 may be located under the top plate member 113. The second outer gas pipe 57 may be coupled to a bottom end portion of the outer gas fitting pipe 53. The first outer gas pipe 51 and the second outer gas pipe 57 may be connected to each other by the outer gas fitting pipe 53.

The outer gas supply pipe 5 is coupled to the top plate member 113 through the outer gas fitting pipe 53 in the above embodiments, but embodiments of the inventive concepts are not limited thereto. In certain embodiments, a single pipe may extend into the top plate member 113 and may be coupled to the top plate member 113. In this case, an additional structure for facilitating a fitting between the single pipe and the top plate member 113 may be provided.

The outer gas supply pipe 5 is coupled to the top plate member 113 in the above embodiments, but embodiments of the inventive concepts are not limited thereto. In certain embodiments, the outer gas supply pipe 5 may be coupled to the lower body 111.

Figure 6:
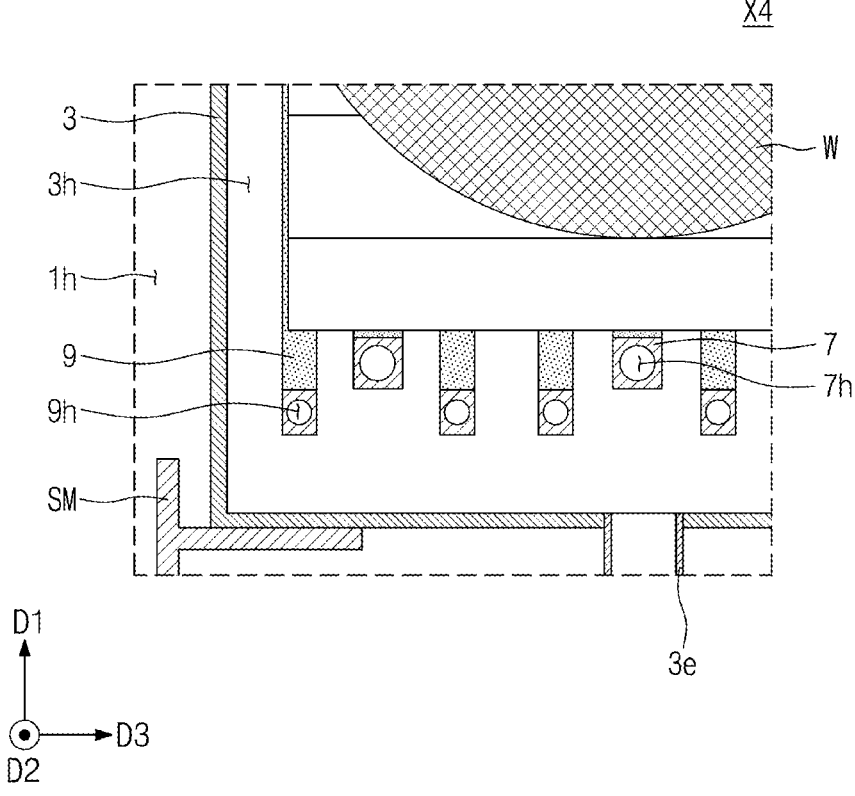
FIG. 6 is an enlarged cross-sectional view of a region 'X4' of FIG. 2.

FIG. 6 is an enlarged cross-sectional view of a region 'X4' of FIG. 2.

Referring to FIG. 6, the inner gas supply pipe 9 may provide an inner gas flow path 9h. The second gas may move through the inner gas flow path 9h.

Figure 7:
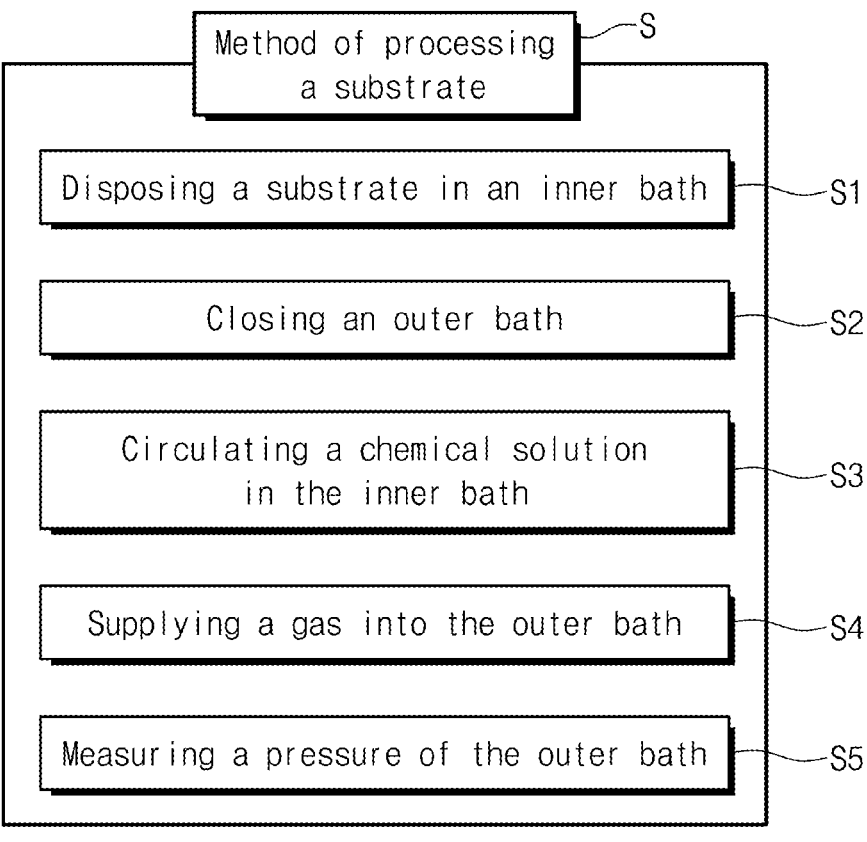
FIG. 7 is a flow chart illustrating a method of processing a substrate according to some embodiments of the inventive concepts.

FIG. 7 is a flow chart illustrating a method of processing a substrate according to some embodiments of the inventive concepts.

Referring to FIG. 7, a method of processing a substrate (S) may be provided. The method of processing a substrate (S) may be a method of performing a process on a substrate using the substrate processing apparatus A (see FIG. 1) described with reference to FIGS. 1 to 6. The method of processing a substrate (S) may include positioning a substrate in the inner bath (S1), closing the outer bath (S2), circulating a chemical solution in the inner bath (S3), supplying a gas into the outer bath (S4), and measuring a pressure of the outer bath (S5).

Hereinafter, the method of processing a substrate (S) in FIG. 7 will be described in more detail with reference to FIGS. 8 to 15.

Figure 8:
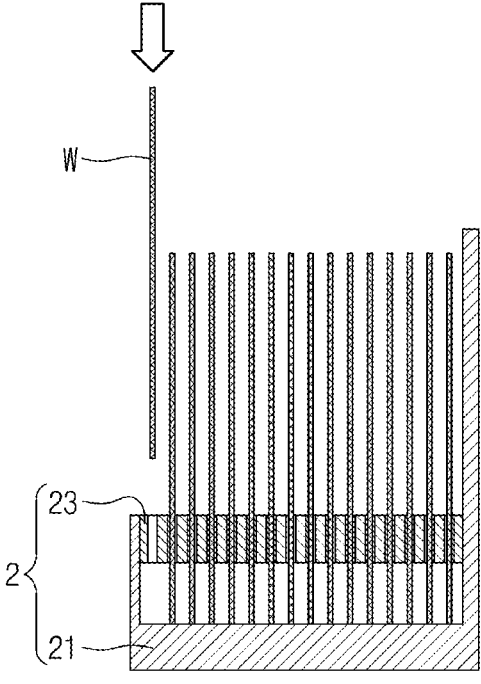
FIGS. 8 to 15 are cross-sectional views illustrating the method of processing a substrate in the flow chart of FIG. 8.

FIGS. 8 to 15 are cross-sectional views illustrating the method of processing a substrate in the flow chart of FIG. 8.

Referring to FIG. 8, the substrate W may be in the substrate supporter 2. A plurality of the substrates W may be in the single substrate supporter 2.

Figure 9:
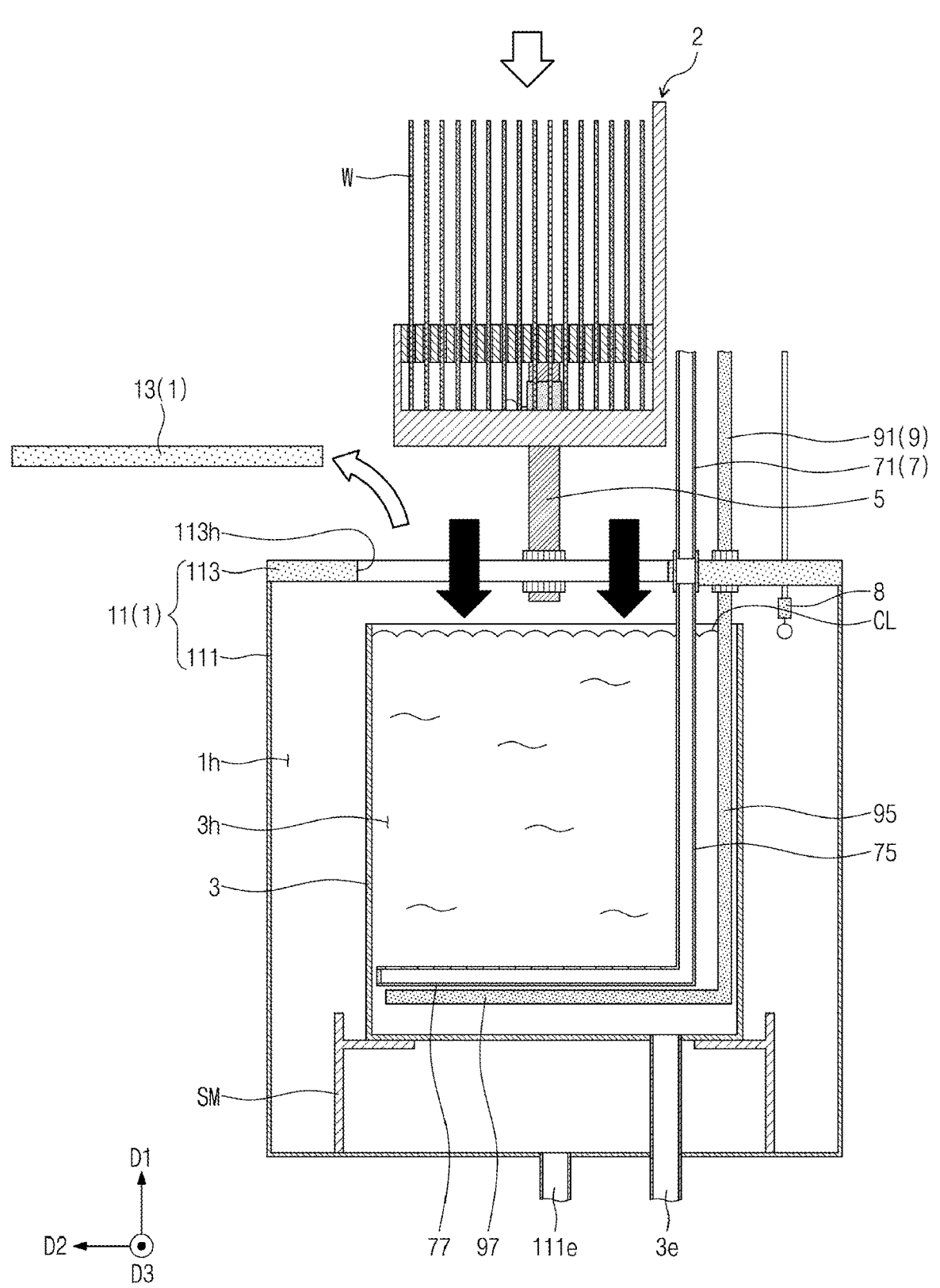
Figure 10:
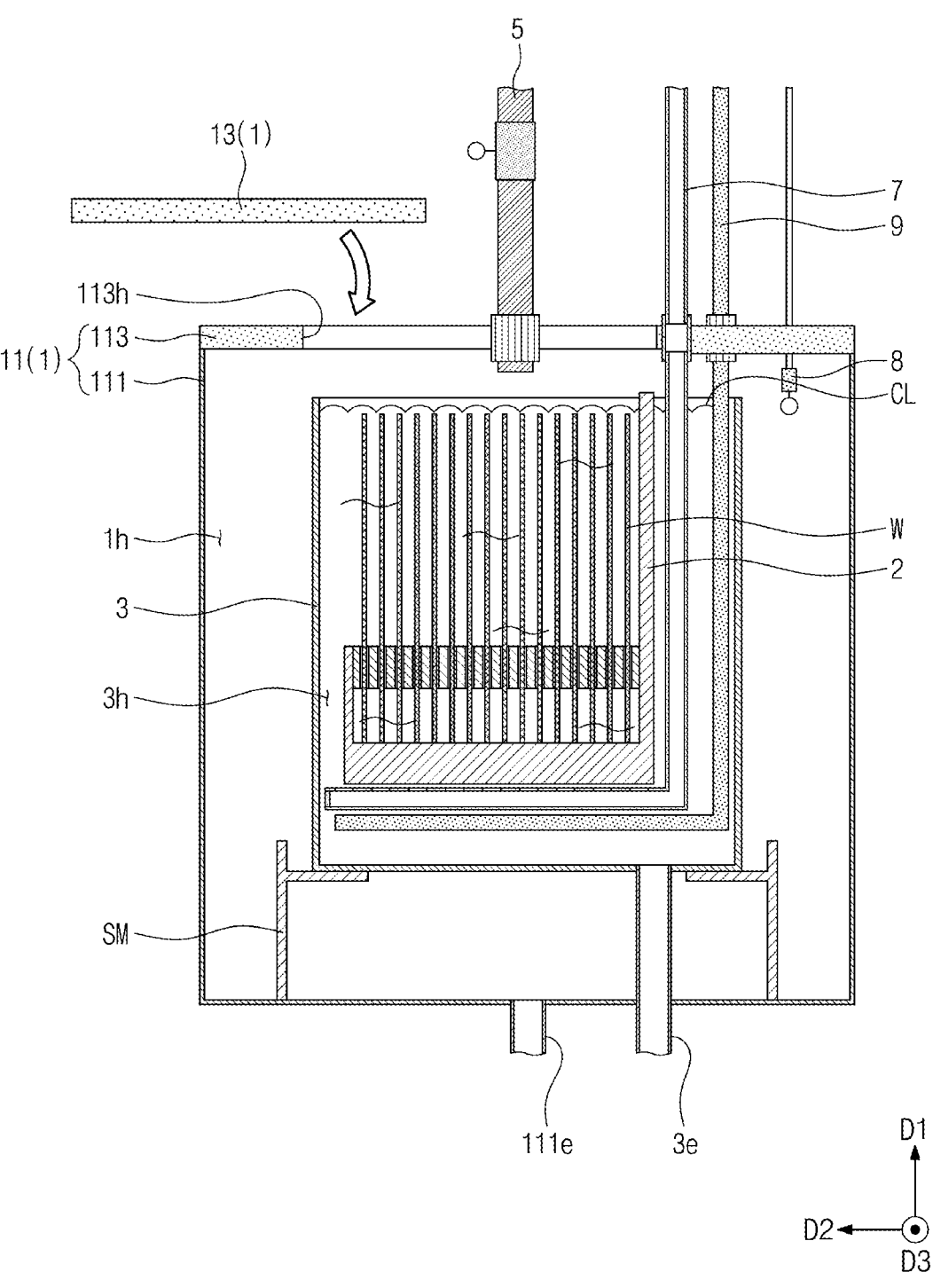

Referring to FIGS. 9, 10 and 7, the positioning of the substrate in the inner bath (51) may include opening the outer door 13. The outer door 13 may be separated from the outer body 11. Thus, the outer receiving space 1h may be exposed. For example, the outer receiving space 1h may be exposed through the substrate insertion hole 113h of the top plate member 113. The operation of separating the outer door 13 from the outer body 11 may be performed by at least one of various methods. For example, the outer door 13 may be separated from the top plate member 113 by a robot arm (not shown). Alternatively, the outer door 13 may be separated from the top plate member 113 by a manual operation.

Positioning the substrate in the inner bath (51) may further include lowering the substrate supporter 2, which supports the substrate W, to position the substrate supporter 2 in the inner bath 3. Thus, the substrate W may be positioned in the inner space 3h. At this time, the inner space 3h may be filled with a chemical solution CL. The substrate supporter 2 may be lowered until the substrate W is completely immersed in the chemical solution CL.

Figure 11:
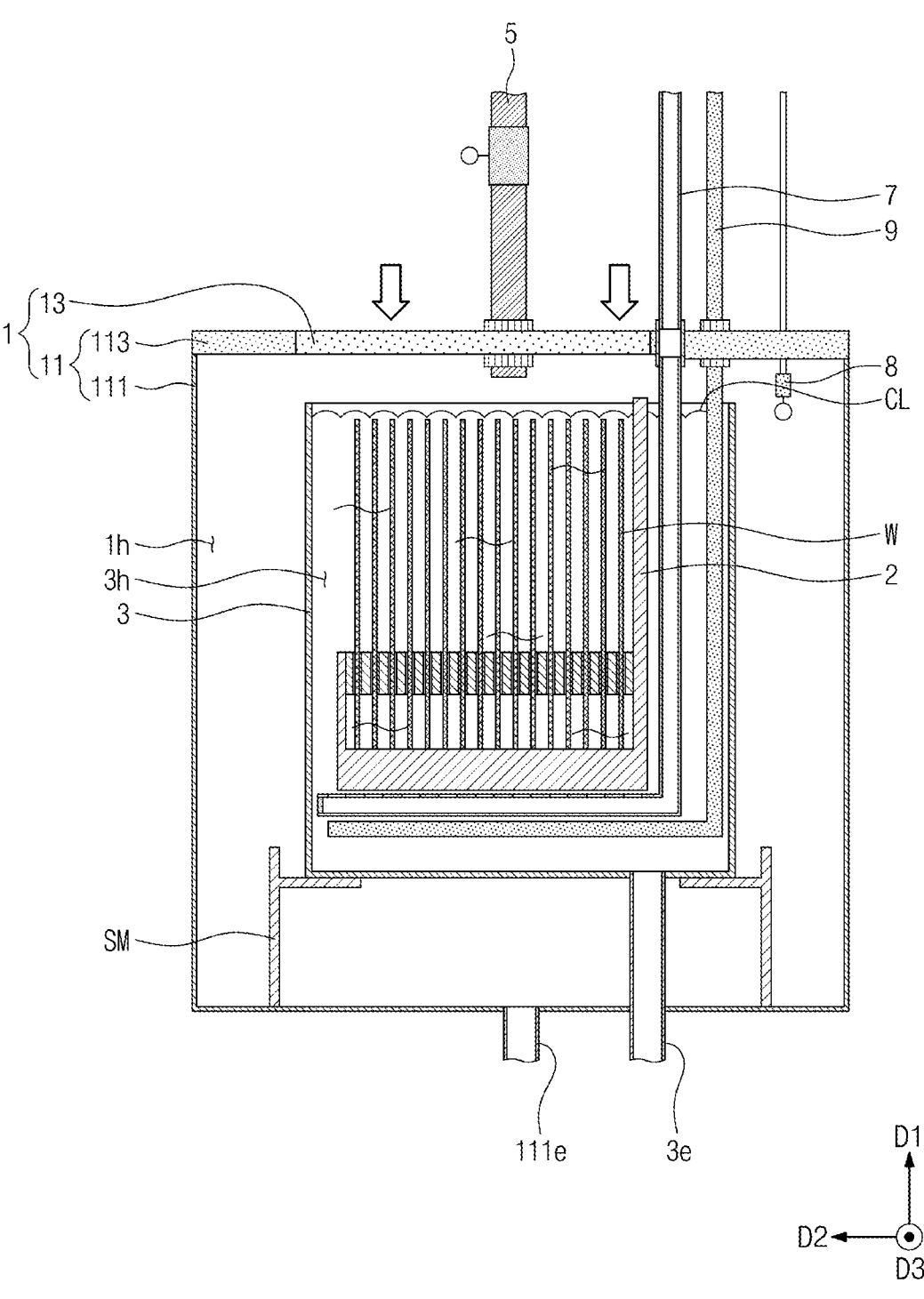

Referring to FIGS. 10, 11 and 7, the closing of the outer bath (S2) may include coupling the outer door 13 to the outer body 11 to close the outer receiving space 1h. More particularly, the outer door 13 may close the substrate insertion hole 113h of the top plate member 113 to close the outer receiving space 1h. For example, the outer door 13 may be inserted into the substrate insertion hole 113h to close the outer receiving space 1h.

Referring to FIGS. 12 to 14 and 7, the circulating of the chemical solution in the inner bath (S3) may include supplying a new chemical solution CLN into the inner bath 3 through the chemical solution supply pipe 7. The new chemical solution CLN may be a chemical solution which is circulated along the chemical solution circulation unit 4 and is filtered. The new chemical solution CLN may flow into the inner space 3h through the nozzle hole 77h.

Referring again to FIG. 12, a portion of the chemical solution CL in the inner bath 3 may overflow. For example, the chemical solution CL may boil at a high temperature to overflow to the outside of the inner bath 3. In this case, the chemical solution CL may flow into the outer receiving space 1h. The chemical solution CL flowing in the outer receiving space 1h may flow again into the chemical solution circulation unit 4 through the chemical solution exhaust port 111e. The chemical solution may be heated and/or filtered in the chemical solution circulation unit 4. The filtered chemical solution may flow again into the inner bath 3 through the chemical solution supply pipe 7.

In this process, a second gas G2 may be supplied. More particularly, the second gas G2 supplied by the inner gas supply unit GS2 may be supplied into the inner space 3h through the inner gas supply pipe 9. The second gas G2 may form bubbles in the inner bath 3. By the bubbles, the new chemical solution CLN may be evenly mixed with the chemical solution CL in the inner bath 3.

Figure 12:
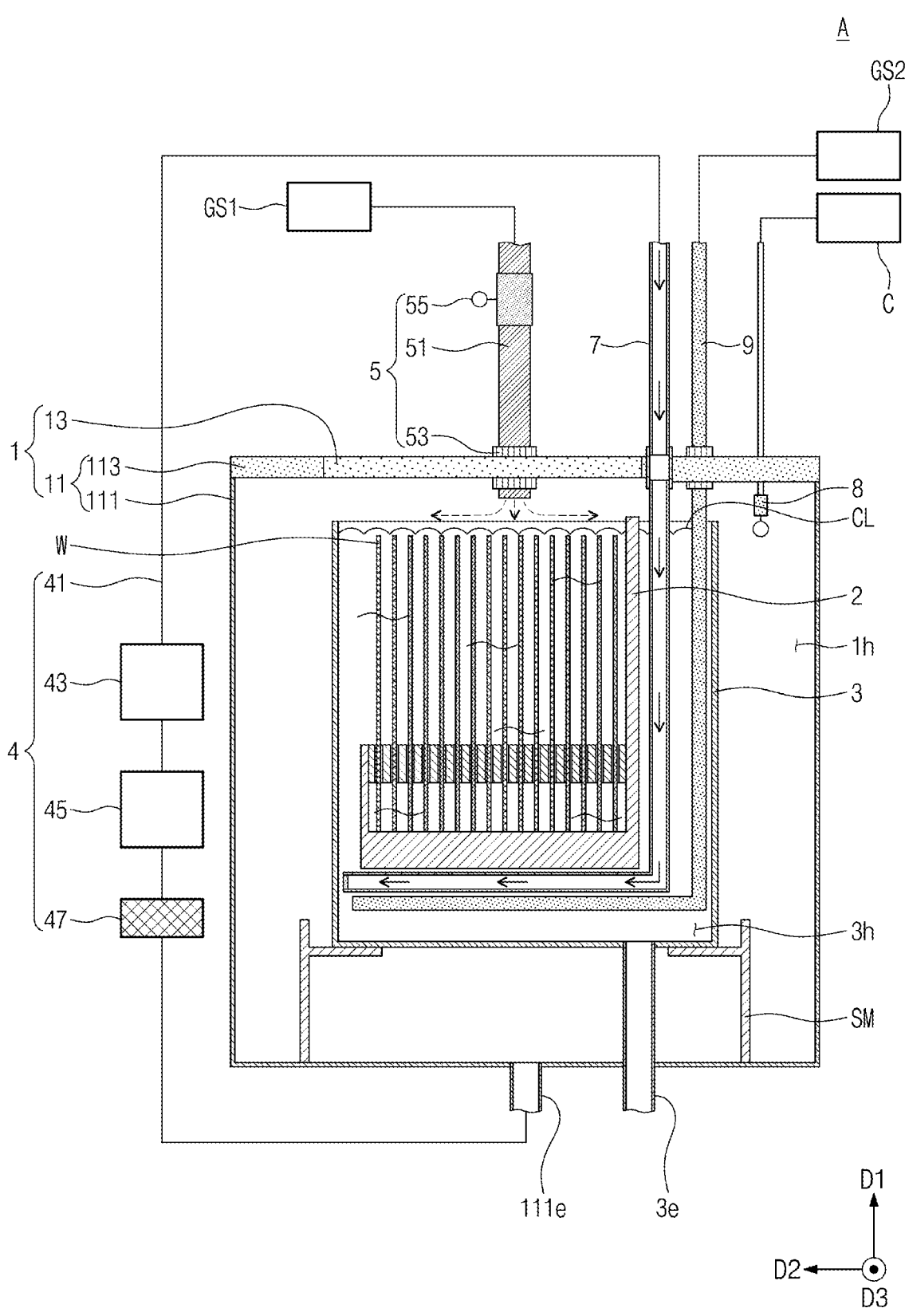
Figure 13:
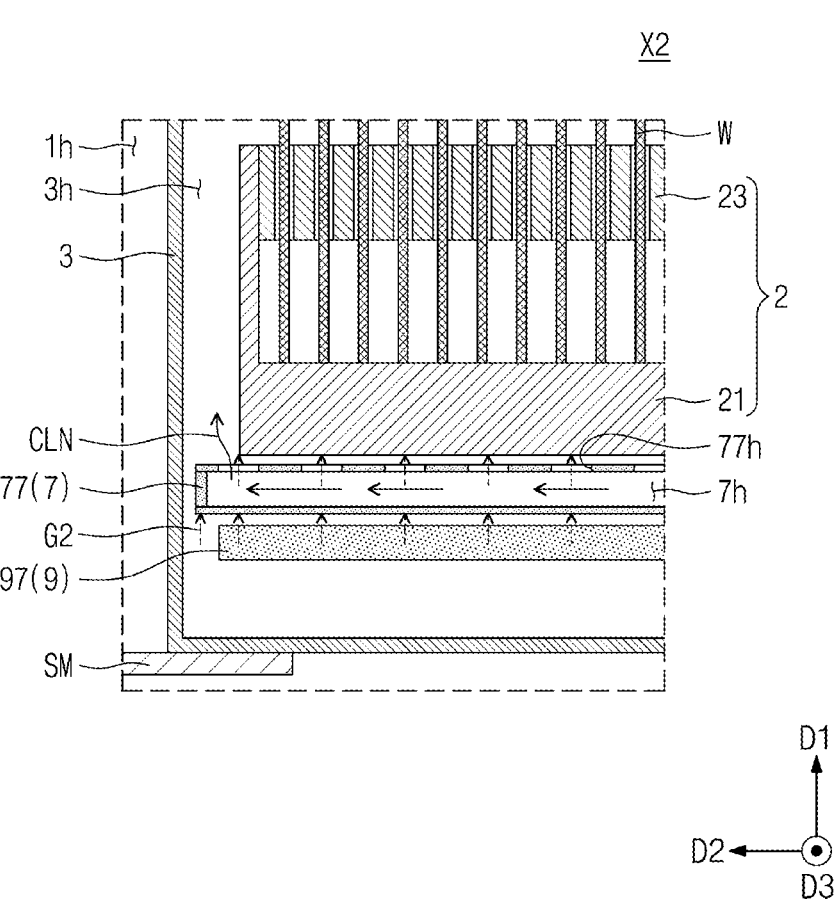
Figure 14:
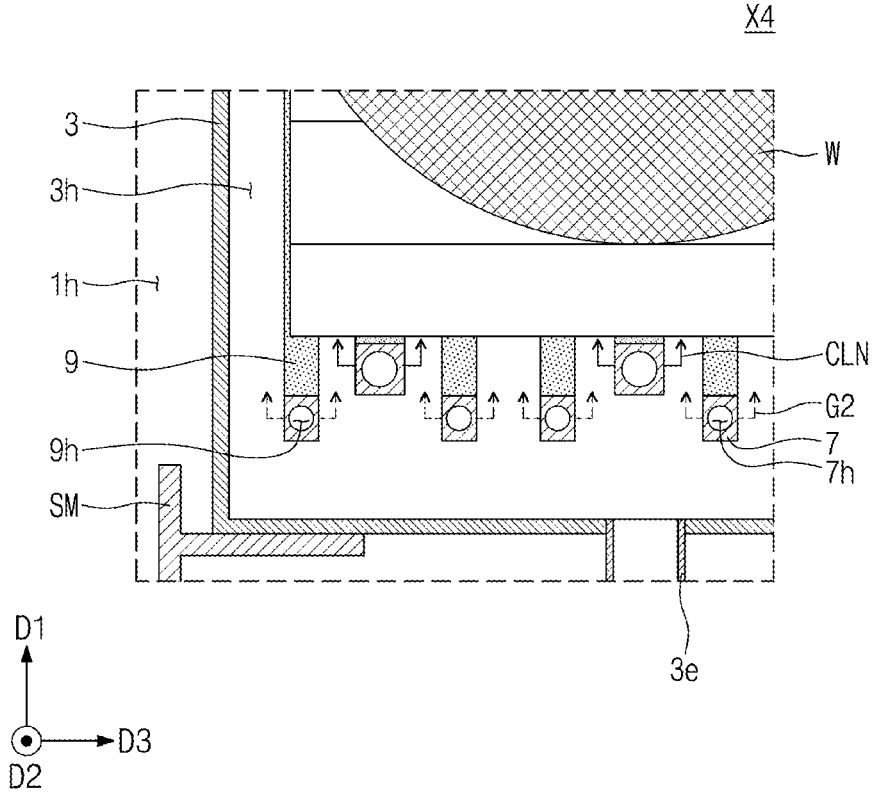
Figure 15:
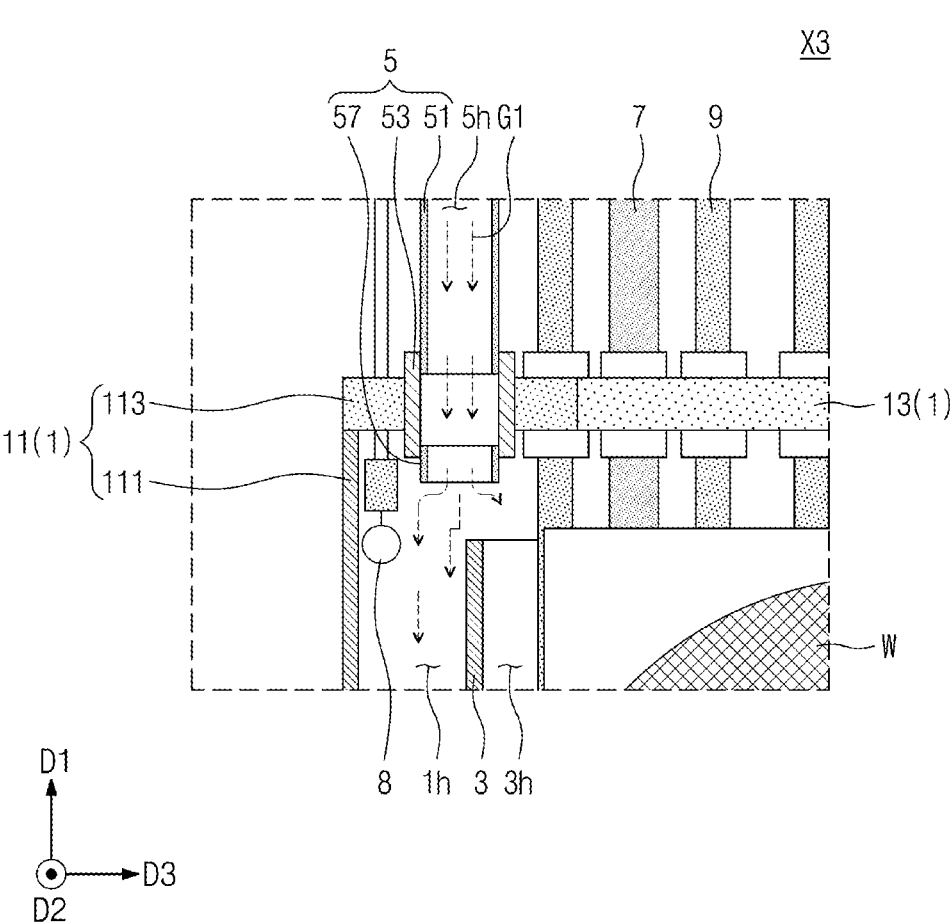

Referring to FIGS. 12, 15 and 7, the supplying of the gas into the outer bath (S4) may include supplying a gas G1 into the outer receiving space 1h. More particularly, the gas G1 supplied by the gas supply unit GS1 may flow into the outer receiving space 1h through the outer gas supply pipe 5. Thus, a pressure of the outer receiving space 1h may be changed. For example, since the outer receiving space 1h is sealed by the outer door 13, the pressure of the outer receiving space 1*h* may rise when the gas G1 is supplied. Thus, a boiling point of the chemical solution CL may rise. Accordingly, the chemical solution CL may be maintained at a higher temperature. In other words, it is possible to prevent the chemical solution CL from boiling at a certain temperature. As a result, a concentration of the chemical solution CL may be maintained at a certain level.

The measuring of the pressure of the outer bath (S5) may include measuring the pressure of the outer receiving space 1*h* by the pressure sensor 81. The pressure sensor 81 may sense the pressure changed by the gas G1. Data sensed by the pressure sensor 81 may be transmitted to the control unit C.

According to the substrate processing apparatus and the method of processing a substrate using the same in the embodiments of the inventive concepts, the outer receiving space may be sealed to control the pressure of the outer receiving space regardless of a pressure of the space outside the outer bath. In particular, the pressure may be measured using the supplying of the gas to precisely control the pressure of the outer receiving space. Thus, the boiling point of the chemical solution in the inner bath may be adjusted. For example, when the rising of the boiling point of the chemical solution is required, the pressure of the outer receiving space may be increased. In this case, the chemical solution may be maintained at a higher temperature. In addition, since evaporation of the chemical solution is reduced, the concentration of the chemical solution may be kept constant. Thus, an etching yield of the substrate may be increased.

According to the substrate processing apparatus and the method of processing a substrate using the same in the embodiments of the inventive concepts, even though the concentration of the chemical solution is changed, the boiling point of the chemical solution may be kept constant by adjusting the pressure. Thus, chemical solutions having various concentrations may be used.

Figure 16:
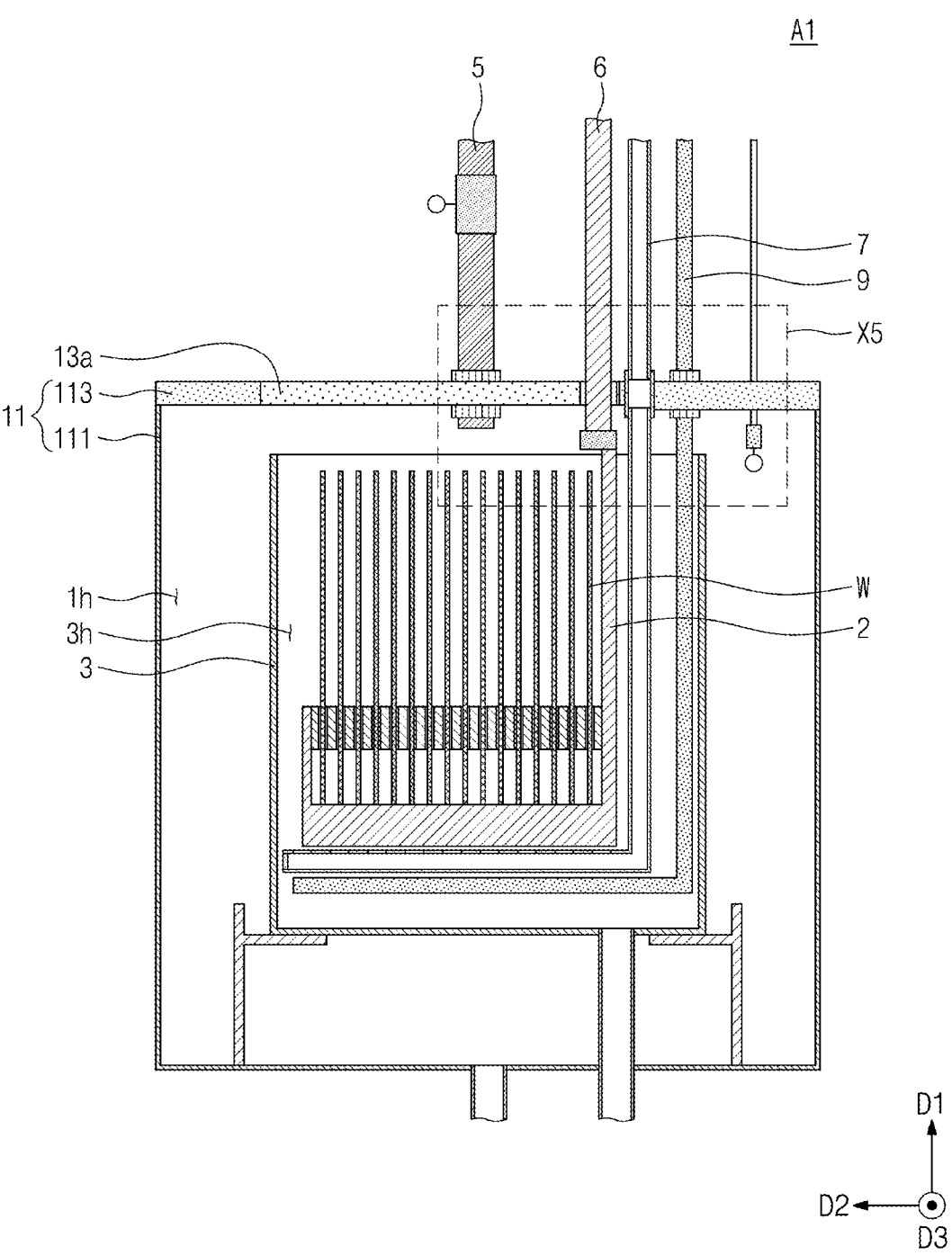
FIG. 16 is a cross-sectional view illustrating a substrate processing apparatus according to some embodiments of the inventive concepts.
Figure 17:
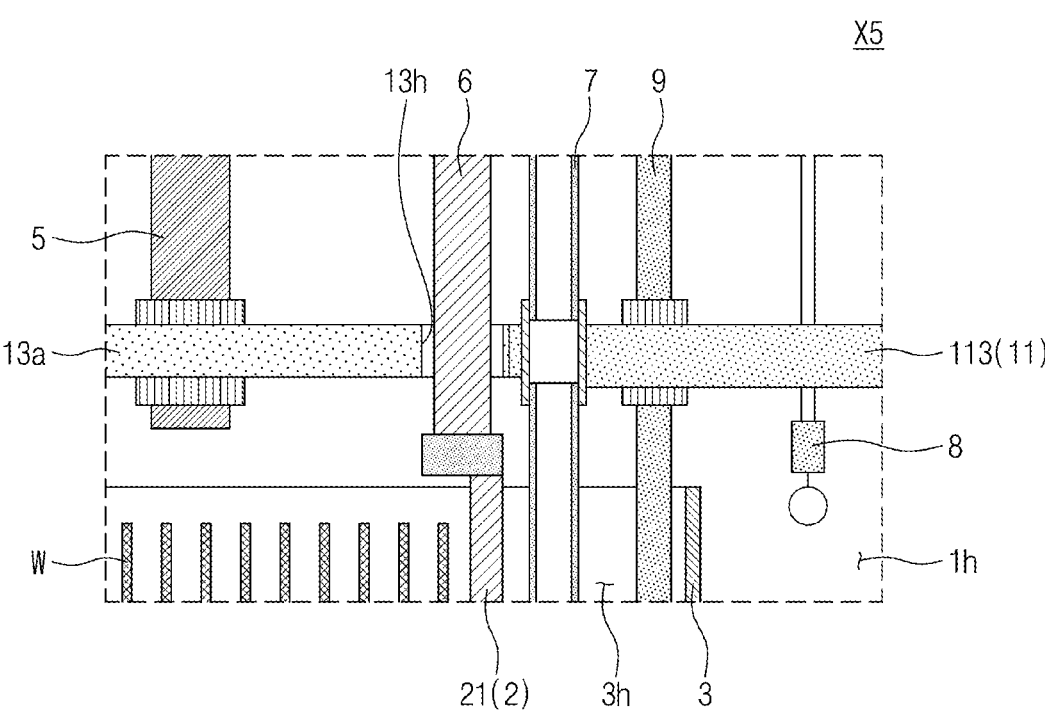
FIGS. 17 and 18 are enlarged cross-sectional views of a region 'X5' of FIG. 16.
Figure 18:
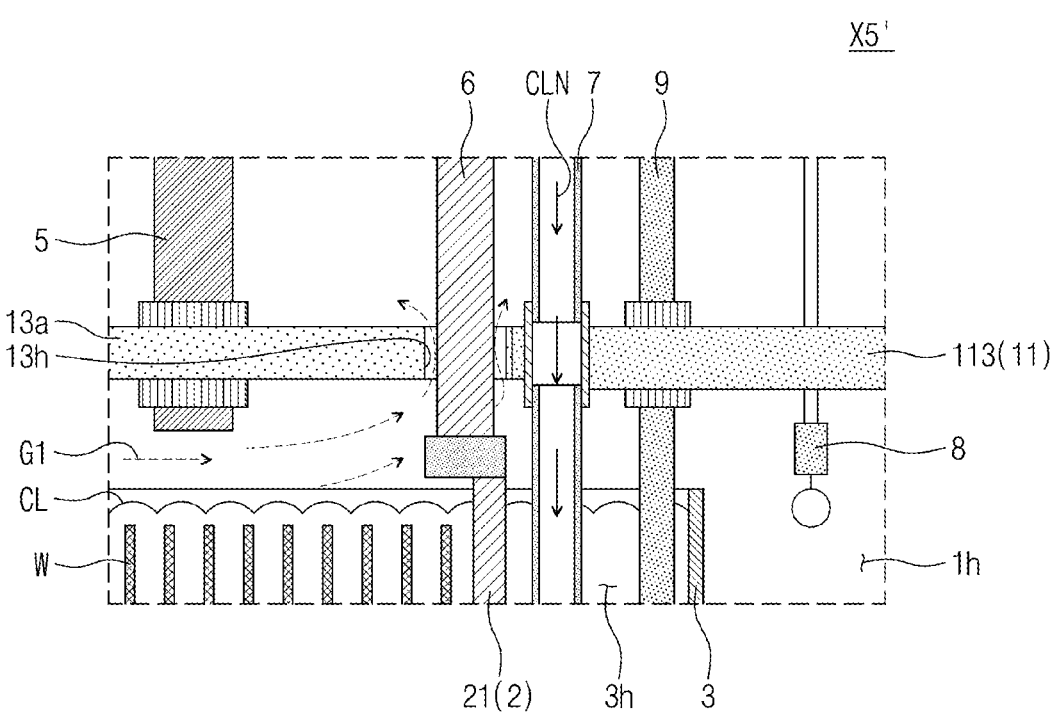

FIG. 16 is a cross-sectional view illustrating a substrate processing apparatus according to some embodiments of the inventive concepts, and FIGS. 17 and 18 are enlarged cross-sectional views of a region 'X5' of FIG. 16.

Hereinafter, the descriptions to the same or similar features as mentioned with reference to FIGS. 1 to 15 will be omitted for the purpose of ease and convenience in explanation.

Referring to FIGS. 16 and 17, an outer door 13*a* may provide a supporting arm insertion hole 13*h*. The supporting arm insertion hole 13*h* may vertically extend into the outer door 13*a*. The substrate supporter 2 may be fixed at a certain position in the inner bath 3 by a supporting arm 6. The supporting arm 6 may vertically extend. The supporting arm 6 may be a portion of a robot arm. The supporting arm 6 may be inserted in the supporting arm insertion hole 13*h*. A space may be provided between the supporting arm 6 and an inner sidewall of the supporting arm insertion hole 13*h* in a state in which the supporting arm 6 is inserted in the supporting arm insertion hole 13*h*.

Referring to FIG. 18, a portion of the gas G1 may escape to the space outside the outer bath 1 through the supporting arm insertion hole 13*h*. To compensate this, the gas G1 having a flow rate equal to or greater than a flow rate of the gas G1 escaping through the supporting arm insertion hole 13*h* may be supplied into the outer receiving space 1*h*. Thus, the pressure of the outer receiving space 1*h* may be maintained to be higher than a pressure of the space outside the outer bath 1.

Figure 19:
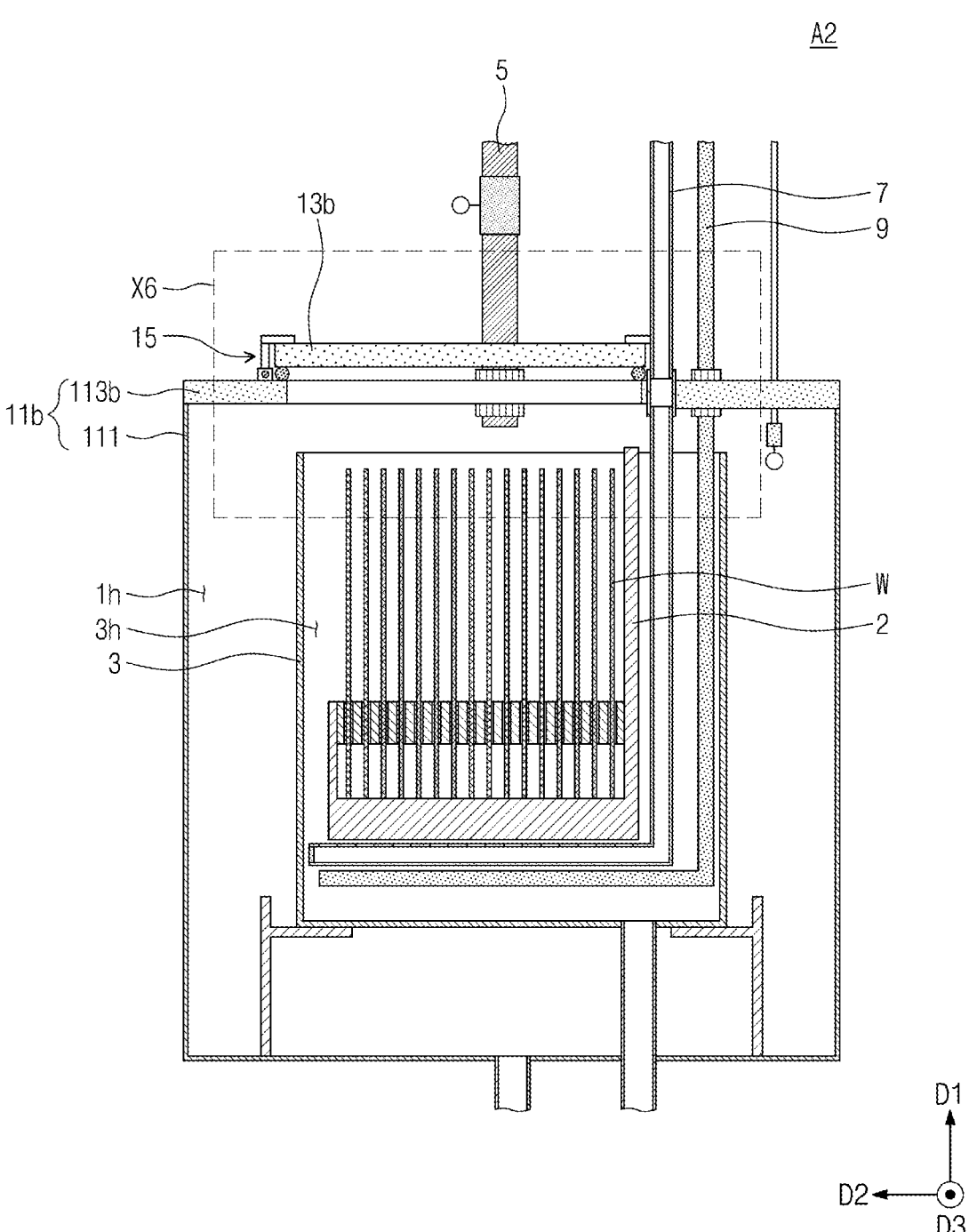
FIG. 19 is a cross-sectional view illustrating a substrate processing apparatus according to some embodiments of the inventive concepts.
Figure 20:
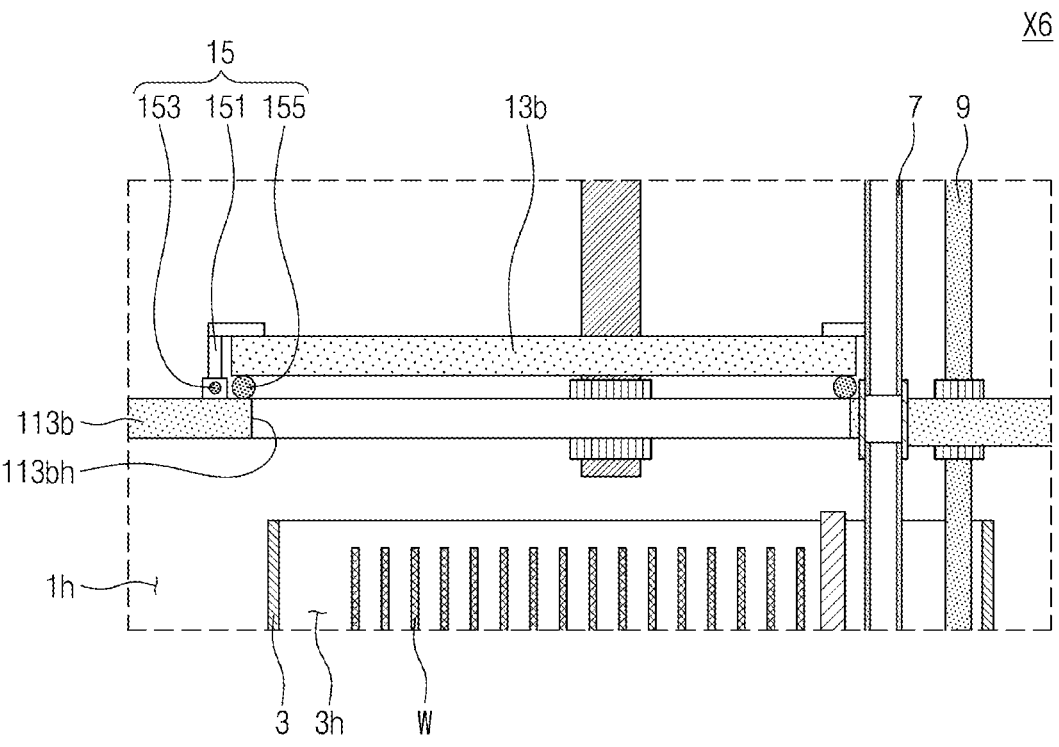
FIGS. 20 and 21 are enlarged cross-sectional views of a region 'X6' of FIG. 19.
Figure 21:
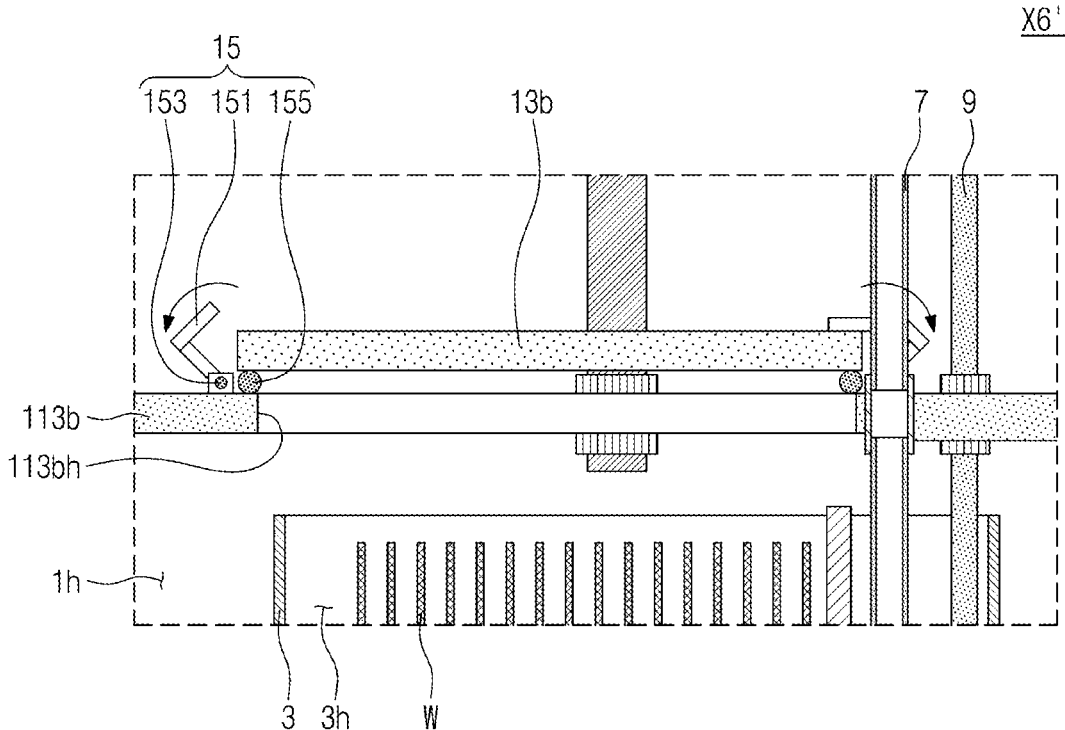

FIG. 19 is a cross-sectional view illustrating a substrate processing apparatus according to some embodiments of the inventive concepts. FIGS. 20 and 21 are enlarged cross-sectional views of a region 'X6' of FIG. 19.

Hereinafter, the descriptions to the same or similar features as mentioned with reference to FIGS. 1 to 18 will be omitted for the purpose of ease and convenience in explanation.

Referring to FIGS. 19 to 21, the outer bath 1 may further include a sealing unit 15. The sealing unit 15 may press an outer door 13*b* coupled to the outer body 11. The sealing unit 15 may include a pressing member 151, a hinge 153, and an O-ring 155. The pressing member 151 may press the outer door 13*b* downwardly. The pressing member 151 may be rotatable on the hinge 153. The O-ring 155 may be between the outer door 13*b* and a top plate member 113*b*. An outflow of the gas in the outer receiving space 1*h* may be prevented by the O-ring 155. The rotary sealing unit is described as an example in the present embodiments, but embodiments of the inventive concepts are not limited thereto.

Figure 22:
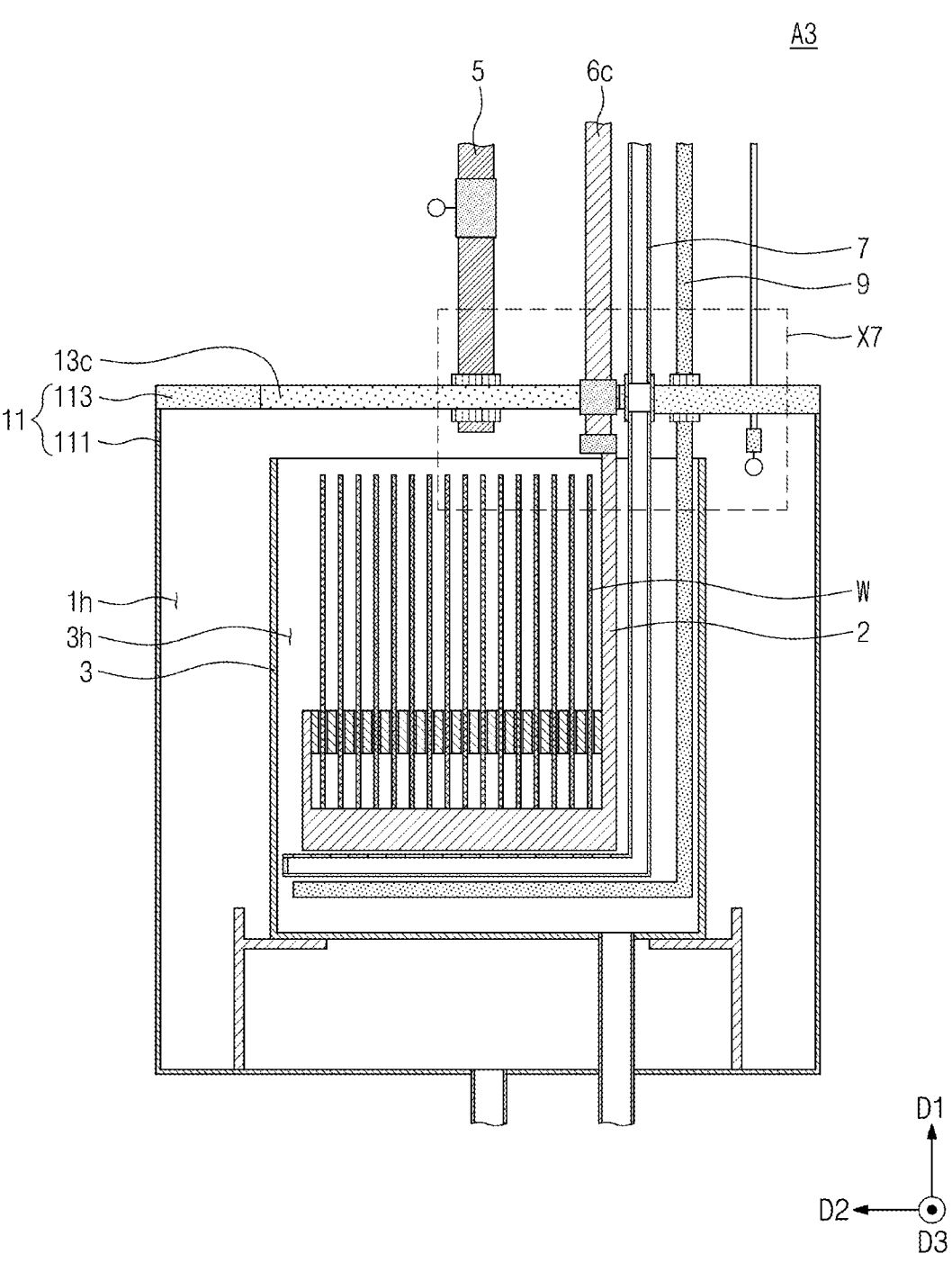
FIG. 22 is a cross-sectional view illustrating a substrate processing apparatus according to some embodiments of the inventive concepts.
Figure 23:
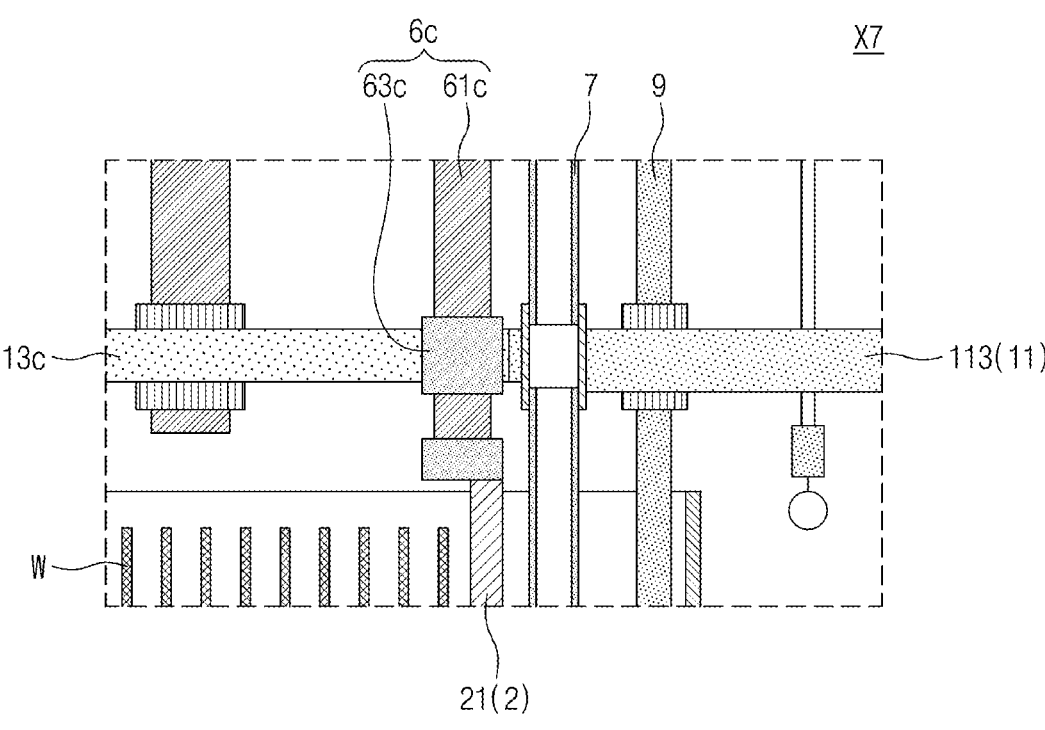
FIG. 23 is an enlarged cross-sectional view of a region 'X7' of FIG. 22.
Figure 24:
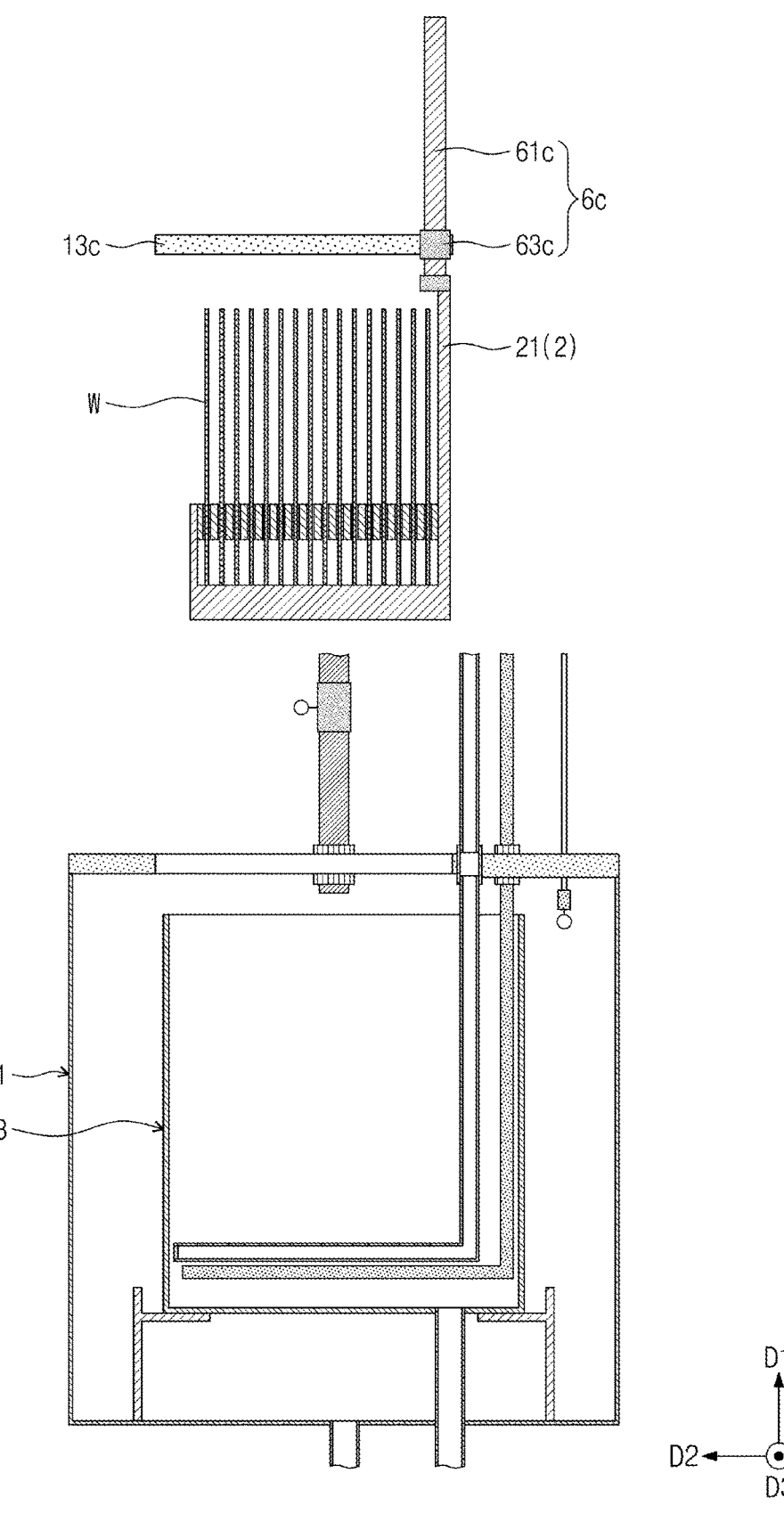
FIG. 24 is a cross-sectional view illustrating a use state of the substrate processing apparatus of FIG. 22.

FIG. 22 is a cross-sectional view illustrating a substrate processing apparatus according to some embodiments of the inventive concepts, FIG. 23 is an enlarged cross-sectional view of a region 'X7' of FIG. 22, and FIG. 24 is a cross-sectional view illustrating a use state of the substrate processing apparatus of FIG. 22.

Hereinafter, the descriptions to the same or similar features as mentioned with reference to FIGS. 1 to 21 will be omitted for the purpose of ease and convenience in explanation.

Referring to FIGS. 22 to 24, the substrate supporter 2 may be supported by a supporting arm 6*c*. The supporting arm 6*c* may be coupled to an outer door 13*c*. For example, the supporting arm 6*c* and the outer door 13*c* may be formed in a single unitary body. More particularly, the supporting arm 6*c* may include a supporting arm body 61*c* and a coupling member 63*c*. The supporting arm 6*c* may be fixed to an outer door 13*c* by the coupling member 63*c*.

According to the substrate processing apparatus and the method of processing a substrate using the same in the embodiments of the inventive concepts, the boiling point of the chemical solution may be adjusted.

According to the substrate processing apparatus and the method of processing a substrate using the same in the embodiments of the inventive concepts, the etching yield of the substrate may be improved.

According to the substrate processing apparatus and the method of processing a substrate using the same in the embodiments of the inventive concepts, a uniform process may be performed regardless of external pressure.

According to the substrate processing apparatus and the method of processing a substrate using the same in the embodiments of the inventive concepts, chemical solutions having various concentrations may be used.

According to the substrate processing apparatus and the method of processing a substrate using the same in the embodiments of the inventive concepts, the concentration of the chemical solution may be kept constant in a process.

While embodiments of the inventive concepts have been particularly shown and described, it will be understood by one of ordinary skill in the art that variations in form and detail may be made therein without departing from the spirit and scope of the attached claims.

What is claimed is:

1. A substrate processing apparatus comprising:
an outer bath;
an inner bath in the outer bath;

a chemical solution supply pipe extending into a portion of the outer bath;

an outer gas supply pipe in fluid communication with the outer bath, a gas supply unit configured to supply a gas into the outer gas supply pipe, a pressure measuring unit comprising a pressure sensor, a control unit configured to control the gas supply unit, wherein the outer bath comprises:

an outer body defining an outer receiving space, wherein the pressure sensor is in the outer receiving space; and an outer door coupled to the outer body and configured to cover the outer receiving space, wherein an end of the outer gas supply pipe is configured to supply gas to the outer receiving space between the outer body and the inner bath, and wherein the chemical solution supply pipe is configured to supply a chemical solution to the inner bath, wherein the control unit is configured to receive data from the pressure measuring unit and to control the gas supply unit to thereby adjust a pressure of the outer receiving space.

2. The substrate processing apparatus of claim 1, wherein the chemical solution supply pipe extends into a portion of the outer body, and wherein the outer gas supply pipe extends into another portion of the outer body.

3. The substrate processing apparatus of claim 2, wherein the outer body comprises:

a lower body of which a top end is opened; and a top plate member coupled onto the lower body, wherein the top plate member provides a substrate insertion opening on the top plate member, wherein the outer door is configured to close the substrate insertion opening to seal the outer receiving space, and wherein each of the chemical solution supply pipe and the outer gas supply pipe vertically extends through the top plate member.

4. The substrate processing apparatus of claim 2, further comprising:

a chemical solution circulation unit configured to supply a chemical solution into the chemical solution supply pipe, wherein the chemical solution supply pipe comprises:

an outer chemical solution pipe connected to the chemical solution circulation unit; and a chemical solution fitting pipe coupled to the outer body, wherein the outer chemical solution pipe is fixed to the outer body through the chemical solution fitting pipe.

5. The substrate processing apparatus of claim 1, wherein the chemical solution supply pipe comprises:

an inner chemical solution pipe located below the outer door and extending vertically; and a chemical solution jet pipe coupled to a bottom end of the inner chemical solution pipe and horizontally extending in the inner bath, wherein the chemical solution jet pipe provides a nozzle hole, and wherein a chemical solution flow path in the chemical solution jet pipe is connected to an inner space of the inner bath through the nozzle hole.

6. The substrate processing apparatus of claim 5, further comprising:

an inner gas supply pipe extending in the outer bath, wherein the inner gas supply pipe comprises:

a gas connection pipe of which at least a portion is located in the inner bath and which extends vertically; and a gas jet pipe which is coupled to a bottom end of the gas connection pipe and extends horizontally, wherein the gas jet pipe is located below the chemical solution jet pipe.

7. The substrate processing apparatus of claim 1, wherein:

the pressure sensor is between the outer body and the inner bath, wherein a level of a top end of the inner bath is lower than a level of a bottom end of the outer door, and wherein the top end of the inner bath is opened such that an inner space of the inner bath is connected to the outer receiving space.

8. A substrate processing apparatus comprising:

an outer bath;

an inner bath in the outer bath;

an outer gas supply pipe configured to supply a gas to an outer receiving space between the outer bath and the inner bath;

a gas supply unit configured to supply the gas into the outer gas supply pipe;

a pressure measuring unit comprising a pressure sensor; and a control unit configured to control gas supply unit;

wherein the outer bath comprises:

an outer body providing the outer receiving space; and an outer door coupled to the outer body and configured to cover the outer receiving space;

wherein the outer gas supply pipe comprises:

a first outer gas pipe connected to the gas supply unit; and an outer gas fitting pipe coupled to the outer body;

wherein the first outer gas pipe is fixed to the outer body through the outer gas fitting pipe;

wherein the control unit is configured to receive data from the pressure measuring unit and to control the gas supply unit to thereby adjust a pressure of the outer receiving space.

9. The substrate processing apparatus of claim 8, wherein the outer body comprises:

a lower body of which a top end is opened; and a top plate member coupled onto the lower body, wherein the top plate member provides a substrate insertion hole on the top plate member, and wherein the outer door is configured to seal the substrate insertion hole to separate the outer receiving space from an space outside the outer body.

10. The substrate processing apparatus of claim 9, further comprising:

a chemical solution supply pipe configured to supply a chemical solution into the inner bath, wherein the chemical solution supply pipe comprises:

an outer chemical solution pipe located above the top plate member;

a chemical solution fitting pipe extending into the top plate member and coupled to the top plate member;

an inner chemical solution pipe located below the top plate member and extending vertically; and a chemical solution jet pipe coupled to a bottom end of the inner chemical solution pipe and extending horizontally, wherein the chemical solution jet pipe provides a nozzle hole, and wherein the nozzle hole connects a flow path in the chemical solution jet pipe to an inner space of the inner bath.

11. The substrate processing apparatus of claim 8, wherein the outer gas supply pipe further comprises: a flow control unit on the first outer gas pipe.

12. The substrate processing apparatus of claim 8, further comprising:

a gas exhaust pipe coupled to the outer body and connected to the outer receiving space between the outer bath and the inner bath.

13. The substrate processing apparatus of claim 8, wherein:

the pressure sensor is located in the outer receiving space between the outer bath and the inner bath.

14. The substrate processing apparatus of claim 8, wherein the outer door provides a supporting arm insertion hole vertically extending into the outer door.

\* \* \* \* \*